United States Patent
Tokioka et al.

(10) Patent No.: US 8,766,085 B2
(45) Date of Patent: Jul. 1, 2014

(54) PHOTOELECTRIC CONVERSION DEVICE AND METHOD OF MANUFACTURING THE SAME

(75) Inventors: Hidetada Tokioka, Tokyo (JP); Hiroya Yamarin, Tokyo (JP); Tae Orita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 337 days.

(21) Appl. No.: 13/256,813

(22) PCT Filed: Mar. 16, 2010

(86) PCT No.: PCT/JP2010/054457
§ 371 (c)(1),
(2), (4) Date: Sep. 15, 2011

(87) PCT Pub. No.: WO2010/107033
PCT Pub. Date: Sep. 23, 2010

(65) Prior Publication Data
US 2012/0000518 A1    Jan. 5, 2012

(30) Foreign Application Priority Data
Mar. 18, 2009    (JP) .................................. 2009-066976

(51) Int. Cl.
| | | |
|---|---|---|
| *H01L 31/00* | (2006.01) | |
| *H01L 21/00* | (2006.01) | |
| *H01L 25/04* | (2014.01) | |
| *H01L 31/05* | (2014.01) | |
| *H01L 31/0216* | (2014.01) | |

(52) U.S. Cl.
CPC .............. *H01L 25/045* (2013.01); *H01L 31/05* (2013.01); *H01L 31/02165* (2013.01)
USPC ............................................ 136/244; 438/67

(58) Field of Classification Search
CPC .............. H01L 31/05; H01L 31/02021; H01L 31/02165; H01L 25/045
USPC ............................................. 136/244; 438/67
See application file for complete search history.

(56) References Cited

U.S. PATENT DOCUMENTS

| | | | |
|---|---|---|---|
| 4,784,701 A | | 11/1988 | Sakai et al. |
| 4,847,669 A | * | 7/1989 | Yamazaki et al. ............. 136/251 |

(Continued)

FOREIGN PATENT DOCUMENTS

| | | |
|---|---|---|
| JP | 59-161081 | 9/1984 |
| JP | 62-221167 | 9/1987 |

(Continued)

OTHER PUBLICATIONS

Office Action issued Mar. 11, 2013 in Chinese Patent Application No. 201080012074.7 (with English translation).

(Continued)

*Primary Examiner* — Eli Mekhlin
(74) *Attorney, Agent, or Firm* — Oblon, Spivak, McClelland, Maier & Neustadt, L.L.P.

(57) ABSTRACT

A photoelectric conversion device is provided in which a first photoelectric conversion module having a plurality of first photoelectric conversion elements formed on one surface of a first translucent insulated substrate and a second photoelectric conversion module having a plurality of photoelectric conversion elements formed on one surface of a second translucent insulated substrate are bonded together with the first photoelectric conversion elements and the second photoelectric conversion elements placed on an inner side. The photoelectric conversion device includes a plurality of photoelectric conversion element pairs formed by electrically connecting, in series, the first photoelectric conversion elements and the second photoelectric conversion elements arranged in positions opposed to each other. All the photoelectric conversion element pairs are electrically connected in series.

11 Claims, 11 Drawing Sheets

(56) References Cited

U.S. PATENT DOCUMENTS

| | | | |
|---|---|---|---|
| 6,515,218 B1* | 2/2003 | Shimizu et al. | 136/256 |
| 7,189,917 B2* | 3/2007 | Okada et al. | 136/255 |
| 2009/0014055 A1* | 1/2009 | Beck et al. | 136/246 |
| 2009/0039340 A1* | 2/2009 | Toda | 257/21 |
| 2010/0059111 A1* | 3/2010 | Shin et al. | 136/256 |
| 2011/0079272 A1 | 4/2011 | Tokioka et al. | |
| 2011/0223709 A1 | 9/2011 | Tokioka et al. | |

FOREIGN PATENT DOCUMENTS

| | | |
|---|---|---|
| JP | 64-41278 | 2/1989 |
| JP | 5-27278 | 2/1993 |
| JP | 7-79004 | 3/1995 |
| JP | 2001-53299 | 2/2001 |
| JP | 2001-308354 | 11/2001 |
| JP | 2003-298090 | 10/2003 |
| JP | 2004-95784 | 3/2004 |
| JP | 2004-179560 | 6/2004 |
| JP | 2005-277113 | 10/2005 |
| JP | 2006-319068 | 11/2006 |
| JP | 2009-259926 | 11/2009 |

OTHER PUBLICATIONS

International Search Report issued Jun. 29, 2010, in PCT/JP2010/054457 with English translation.

Japanese Office Action issued Sep. 17, 2013, in Japan Patent Application No. 2011-504850 (with Partial English translation).

* cited by examiner

PHOTOELECTRIC CONVERSION DEVICE AND METHOD OF MANUFACTURING THE SAME

FIELD

The present invention relates to a photoelectric conversion device and a method of manufacturing the photoelectric conversion device, and, more particularly to a thin-film photoelectric conversion device of a mechanical stack type in which two kinds of photoelectric conversion elements respectively formed on different substrates are arranged to be opposed to each other and a method of manufacturing the thin-film photoelectric conversion device.

BACKGROUND

A thin-film photoelectric conversion device of a mechanical stack type in the past includes, for example, a photoelectric conversion module in which thin-film semiconductor layers are formed as photoelectric conversion layers on a substrate having a transmissive electrode formed thereon and a photoelectric conversion module in which thin-film semiconductor layers are formed as photoelectric conversion elements on a substrate having a reflective metal electrode layer formed thereon. With the two substrates opposed to each other, the photoelectric conversion modules are bonded such that surfaces of the respective substrates on which the thin-film semiconductor layers are not formed are arranged on the outer side. Outputs are separately extracted from the photoelectric conversion modules. In each of the photoelectric conversion modules, in a state in which a plurality of photoelectric conversion elements processed in a stripe shape are arranged with the elements adjacent to each other spaced a predetermined distance apart from each other, the photoelectric conversion layers adjacent to each other are formed to be electrically connected in series while being electrically separated.

In such a photoelectric conversion device of the mechanical stack type, the photoelectric conversion modules to be laminated are respectively formed on independent substrates. Therefore, there is an advantage that processes of formation of the respective photoelectric conversion modules are simplified and manufacturing yield is improved. There is also an advantage that, even if one of the substrates causes a failure during manufacturing, the remaining substrate can be stacked on another substrate and used. On the other hand, in a laminated thin-film photoelectric conversion device formed by continuously forming films on a single substrate, performance is higher than that of the mechanical stack type. However, when a failure occurs in a part of layers, the entire photoelectric conversion device cannot be reused and manufacturing yield is deteriorated.

In the thin-film photoelectric conversion device of the mechanical stack type, to improve efficiency, a band gap of the photoelectric conversion layers formed on the substrate on a light incident side is set wider than a band gap of the photoelectric conversion layers formed on the other substrate. Consequently, light having high energy (short wavelength) is absorbed by the photoelectric conversion elements formed on the substrate on the light incident side and light transmitted through the photoelectric conversion elements is absorbed by the photoelectric conversion elements formed on the other substrate. Therefore, it is possible to efficiently use the light.

CITATION LIST

Patent Literature

Patent Literature 1: Japanese Patent Application Laid-Open No. H5-27278

SUMMARY

Technical Problem

However, in such a thin-film photoelectric conversion device of the mechanical stack type, because the band gaps of the photoelectric conversion layers formed on the respective substrates are different, open-circuit voltages take different values in the respective substrates. Therefore, power generation outputs need to be independently extracted in the respective substrates. Therefore, there is a problem in that output extracting sections are necessary in the respective substrates, member costs increase, and the structure of the output extracting sections is complicated.

To solve such a problem, for example, there is proposed a technology for adjusting the numbers of series steps of the photoelectric conversion elements formed on the respective substrates to set output voltages substantially the same and reducing the extracting sections to a single extracting section (see, for example, Patent Literature 1). However, even if this method is adopted, the structure of the output extracting section that extracts outputs from both the modules is still complicated. The numbers of series steps of the photoelectric conversion elements formed on the substrates having the same size and connected in series are different in the two substrates. Therefore, there is a problem in that performance equivalent to that of the laminated thin-film photoelectric conversion device, in which the numbers of the photoelectric conversion elements of the substrates are the same, cannot be realized and power generation efficiency of an entire stack module is deteriorated.

The present invention has been devised in view of the above and it is an object of the present invention to obtain a photoelectric conversion device of a mechanical stack type that can inexpensively realize, with a simple configuration, high power generation efficiency same as that of the laminated thin-film photoelectric conversion device and a method of manufacturing the photoelectric conversion device of the mechanical stack type.

Solution to Problem

In order to solve the above problem and in order to attain the above object, in a photoelectric conversion device in which a first photoelectric conversion module having a plurality of first photoelectric conversion elements formed on one surface of a first translucent insulated substrate and a second photoelectric conversion module having a plurality of photoelectric conversion elements formed on one surface of a second translucent insulated substrate are bonded together with the first photoelectric conversion elements and the second photoelectric conversion elements placed on an inner side, the photoelectric conversion device of the present invention includes: a plurality of photoelectric conversion element pairs formed by electrically connecting, in series, the first photoelectric conversion elements and the second photoelectric conversion elements arranged in positions opposed to each other. Additionally, all the photoelectric conversion element pairs are electrically connected in series.

Advantageous Effects of Invention

According to the present invention, the photoelectric conversion element pair formed by electrically connecting in series the first photoelectric conversion element and the second photoelectric conversion element arranged in the opposed positions is electrically connected in series, whereby the photoelectric conversion elements operates at an optimum operating point. Consequently, there is an effect that it is possible to inexpensively obtain, with a simple configuration, a photoelectric conversion device of a mechanical stack type having high power generation efficiency same as that of the laminated thin-film photoelectric conversion device.

BRIEF DESCRIPTION OF DRAWINGS

FIG. 1-2 is a main part sectional view for explaining a sectional structure of the photoelectric conversion device of the mechanical stack type according to the first embodiment of the present invention.

FIG. 1-3 is a main part sectional view for explaining a sectional structure of the photoelectric conversion device of the mechanical stack type according to the first embodiment of the present invention.

FIG. 2 is an equivalent circuit diagram of the photoelectric conversion device of the mechanical stack type according to the first embodiment of the present invention.

FIG. 3 is an equivalent circuit diagram of a photoelectric conversion device of a mechanical stack type in the past.

FIG. 5-1 is a sectional view for explaining a manufacturing process for the photoelectric conversion device of the mechanical stack type according to the first embodiment of the present invention.

FIG. 5-2 is a sectional view for explaining the manufacturing process for the photoelectric conversion device of the mechanical stack type according to the first embodiment of the present invention.

FIG. 5-3 is a sectional view for explaining the manufacturing process for the photoelectric conversion device of the mechanical stack type according to the first embodiment of the present invention.

FIG. 5-4 is a sectional view for explaining the manufacturing process for the photoelectric conversion device of the mechanical stack type according to the first embodiment of the present invention.

FIG. 5-5 is a sectional view for explaining the manufacturing process for the photoelectric conversion device of the mechanical stack type according to the first embodiment of the present invention.

FIG. 5-6 is a sectional view for explaining the manufacturing process for the photoelectric conversion device of the mechanical stack type according to the first embodiment of the present invention.

FIG. 6-1 is a plan view of a schematic configuration of a photoelectric conversion device of a mechanical stack type according to a second embodiment of the present invention.

FIG. 6-2 is a main part sectional view for explaining a sectional structure of the photoelectric conversion device of the mechanical stack type according to the second embodiment of the present invention.

FIG. 6-3 is a main part sectional view for explaining a sectional structure of the photoelectric conversion device of the mechanical stack type according to the second embodiment of the present invention.

FIG. 7-1 is a plan view of a schematic configuration of a photoelectric conversion device of a mechanical stack type according to a third embodiment of the present invention.

FIG. 7-2 is a main part sectional view for explaining a sectional structure of the photoelectric conversion device of the mechanical stack type according to the third embodiment of the present invention.

FIG. 7-3 is a main part sectional view for explaining a sectional structure of the photoelectric conversion device of the mechanical stack type according to the third embodiment of the present invention.

FIG. 7-4 is a main part sectional view for explaining a selective reflection layer of the photoelectric conversion device of the mechanical stack type according to the third embodiment of the present invention.

FIG. 7-5 is a main part sectional view for explaining wavelength dependency of reflectance of the selective reflection layer of the photoelectric conversion device of the mechanical stack type according to the third embodiment of the present invention.

FIG. 8-1 is a sectional view for explaining a manufacturing process for the photoelectric conversion device of the mechanical stack type according to the third embodiment of the present invention.

FIG. 8-2 is a sectional view for explaining the manufacturing process for the photoelectric conversion device of the mechanical stack type according to the third embodiment of the present invention.

FIG. 8-3 is a sectional view for explaining the manufacturing process for the photoelectric conversion device of the mechanical stack type according to the third embodiment of the present invention.

FIG. 8-4 is a sectional view for explaining the manufacturing process for the photoelectric conversion device of the mechanical stack type according to the third embodiment of the present invention.

FIG. 8-5 is a sectional view for explaining the manufacturing process for the photoelectric conversion device of the mechanical stack type according to the third embodiment of the present invention.

FIG. 8-6 is a sectional view for explaining the manufacturing process for the photoelectric conversion device of the mechanical stack type according to the third embodiment of the present invention.

DESCRIPTION OF EMBODIMENTS

Figure 1:
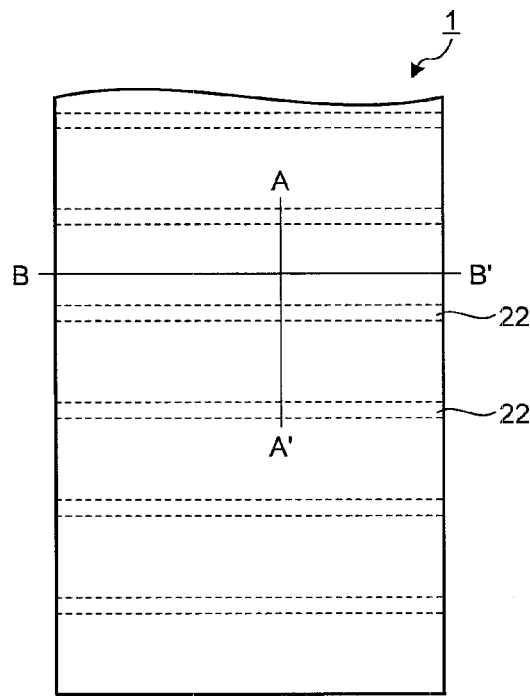
FIG. 1-1 is a plan view of a schematic configuration of a photoelectric conversion device of a mechanical stack type according to a first embodiment of the present invention.

Embodiments of a photoelectric conversion device and a method of manufacturing the photoelectric conversion device according to the present invention are explained in detail below with reference to the drawings. The present invention is not limited to the following description and can be changed as appropriate without departing from the spirit of the present invention. In the drawings referred to below, for ease of understanding, in some case, scales of members are different from actual scales. The same holds true among the drawings.

First Embodiment

Figures 1, 2:
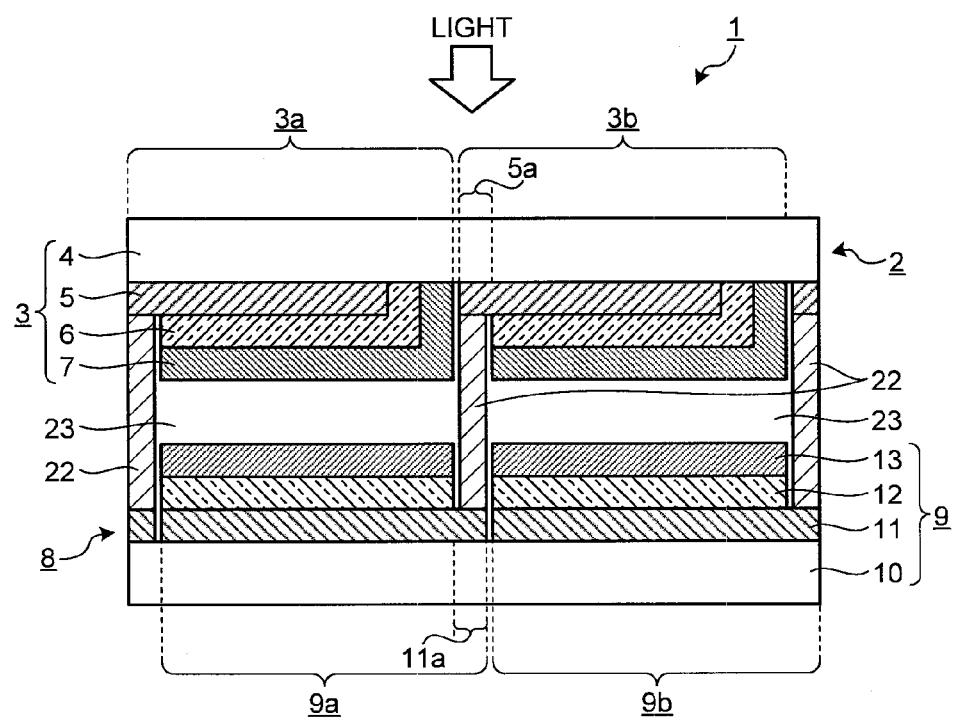
Figures 1, 2, 3:
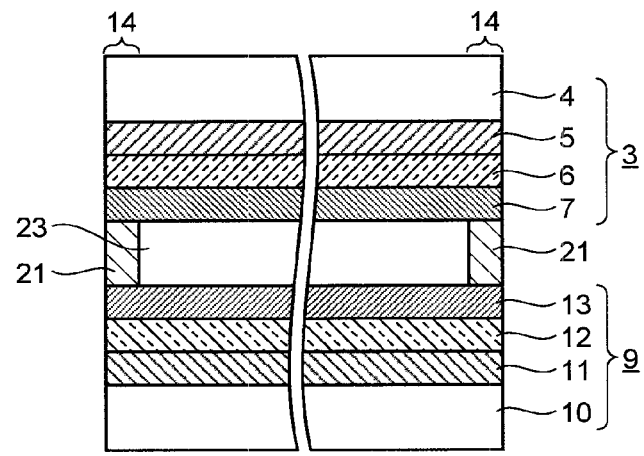
Figure 2:
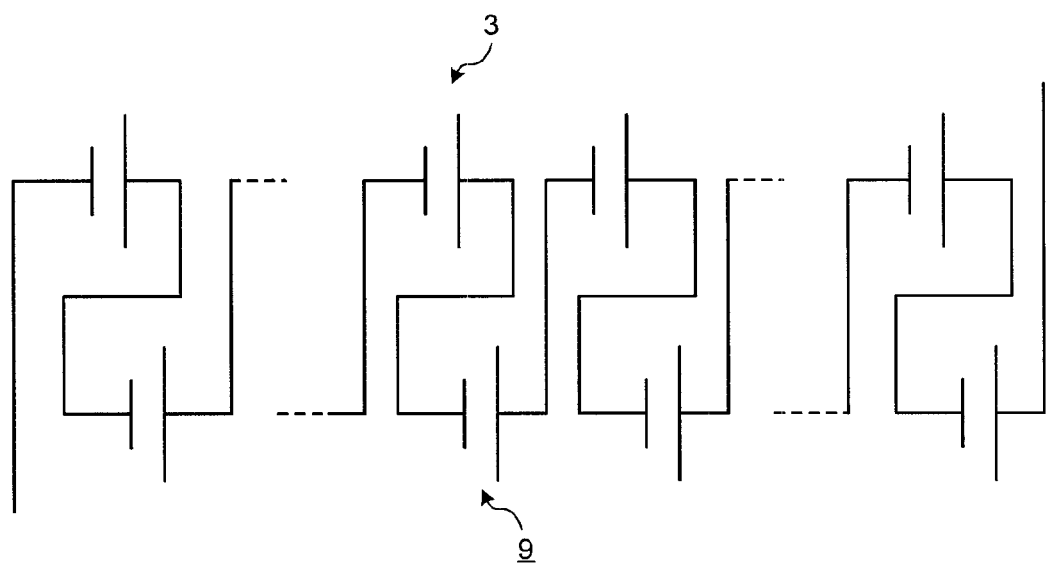
Figure 3:
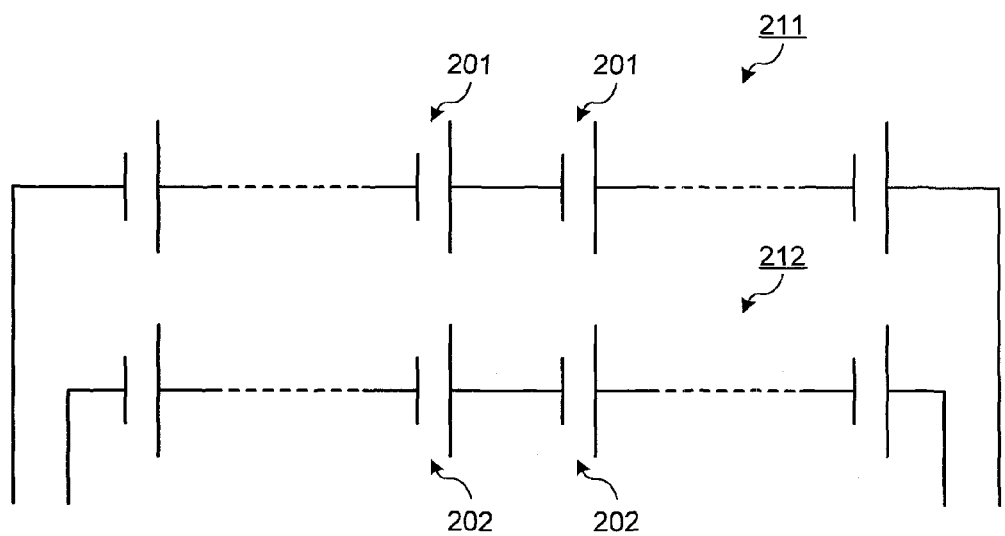

FIG. 1-1 is a plan view of a schematic configuration of a photoelectric conversion device 1 of a mechanical stack type according to a first embodiment of the present invention. FIG. 1-2 is a diagram for explaining a sectional structure of the photoelectric conversion device 1 and is a main part sectional view in a line segment A-A' direction of FIG. 1-1. FIG. 1-3 is a diagram for explaining a sectional structure of the photoelectric conversion device 1 and is a main part sectional view in a line segment B-B' direction of FIG. 1-1.

The photoelectric conversion device 1 of the mechanical stack type according to the first embodiment has a configuration in which a first photoelectric conversion module 2 and a second photoelectric conversion module 8, which are two thin-film photoelectric conversion modules in each of which a plurality of photoelectric conversion elements are formed on a translucent insulated substrate, are bonded together with the photoelectric conversion elements placed on the inner side. Light is made incident from the first photoelectric conversion module 2 side. An intermediate layer 23 held between the first photoelectric conversion module 2 and the second photoelectric conversion module 8 is formed of light transmissive resin or a selective light reflecting film having wavelength selectivity.

The first photoelectric conversion module 2 includes a plurality of photoelectric conversion elements 3a and 3b (hereinafter generally referred to as photoelectric conversion element 3 in some case), which are first photoelectric conversion elements. The photoelectric conversion element 3 is formed by sequentially laminating, on a translucent insulated substrate 4, which is a first translucent insulated substrate, a transparent electrode layer 5, which is a first transparent electrode layer, patterned in a stripe shape that has a texture structure (not shown) on a front surface on the opposite side of the translucent insulated substrate 4 and extends in a direction substantially parallel to a latitudinal direction of the translucent insulated substrate 4, a thin-film semiconductor layer 6, which is a first thin-film semiconductor layer, patterned in a stripe shape that extends in the direction substantially parallel to the latitudinal direction of the translucent insulated substrate 4 in shape and arrangement different from those of the transparent electrode layer 5, and a rear-surface transparent electrode layer 7, which is a second transparent electrode layer, patterned in a stripe shape that extends in the direction substantially parallel to the latitudinal direction of the translucent insulated substrate 4 in shape and arrangement different from those of the transparent electrode layer 5 and the thin-film semiconductor layer 6. In the first photoelectric conversion module 2, the photoelectric conversion elements 3 adjacent to each other are not electrically connected.

The thin-film semiconductor layer 6 has a cross section of a general L-shape to cover a most part on the second photoelectric conversion module 8 side of the transparent electrode layer 5 and to be connected to the translucent insulated substrate 4 at one end in a longitudinal direction of the translucent insulated substrate 4 in the transparent electrode layer 5. The rear-surface transparent electrode layer 7 has a cross section of a general L-shape to cover the entire part on the photoelectric conversion module 8 side of the thin-film semiconductor layer 6 and to be connected to the translucent insulated substrate 4 at one end in the longitudinal direction of the translucent insulated substrate 4 in the transparent electrode layer 5.

In FIG. 1-2, the two photoelectric conversion elements 3a and 3b adjacent to each other of the first photoelectric conversion module 2 are shown. However, the number of photoelectric conversion elements included in the first photoelectric conversion module 2 is not limited to this. A large number of photoelectric conversion elements 3 are formed on the translucent insulated substrate 4.

In the photoelectric conversion device 1 of the mechanical stack type, because light is made incident from the first photoelectric conversion module 2 side, as the translucent insulated substrate 4, a tabular member or a sheet-like member formed of an insulative material having translucency such as glass or transparent resin is used.

In the transparent electrode layer 5, a transparent conductive oxide (TCO) such as tin oxide ($SnO_2$), zinc oxide (ZnO), or indium oxide ($In_2O_3$) is used as a transparent conductive film having light transmissivity. The transparent electrode layer 5 is formed using a method such as a CVD (Chemical Vapor Deposition) method, a sputtering method, or a vapor deposition method. The transparent electrode layer 5 has a front-surface texture structure (not shown) in which an uneven shape is formed on the surface on the opposite side of the translucent insulated substrate 4. This texture structure has a function of scattering incident sunlight, causing the first photoelectric conversion module 2 and the second photoelectric conversion module 8 to more efficiently absorb the incident light, and improving light use efficiency. When necessary, an undercoat layer formed of silicon oxide ($SiO_2$) or the like can be formed on the translucent insulated substrate 4 as a layer for blocking impurities from the translucent insulated substrate 4.

The thin-film semiconductor layer 6 is arranged behind the transparent electrode layer 5 viewed from the light incident side, has a P-I-N structure, and is formed by laminating one or more thin-film semiconductor layers that perform power generation using incident light. The thin-film semiconductor layer 6 forms a PIN junction including, from the translucent insulated substrate 4 side, a P-type semiconductor layer, which is a first conductive semiconductor layer, an I-type semiconductor layer, which is a substantially intrinsic photoelectric conversion layer and is a second conductive semiconductor layer, and an N-type semiconductor layer, which is a third conductive semiconductor layer. In this embodiment, the thin-film semiconductor layer 6 forms a P-I-N junction including, in order from the translucent insulated substrate 4 side, a p-type hydrogenated amorphous silicon carbide (a-SiC:H) layer, which is the first conductive semiconductor layer, an i-type hydrogenated amorphous silicon (a-Si:H) layer, which is the second conductive semiconductor layer, and an n-type hydrogenated amorphous silicon (a-Si:H) layer, which is the third conductive semiconductor layer.

The thin-film semiconductor layer 6 can have a configuration of a two-stage P-I-N junction including, from the translucent insulated substrate 4 side, a p-type hydrogenated amorphous silicon carbide (a-SiC:H) layer, which is the first conductive semiconductor layer, an i-type hydrogenated amorphous silicon (a-Si:H) layer, which is the second conductive semiconductor layer, an n-type hydrogenated microcrystalline silicon (μc-Si:H) layer, which is the third conductive semiconductor layer, a p-type hydrogenated microcrystalline silicon (μc-Si:H) layer, which is the first conductive semiconductor layer, an i-type hydrogenated microcrystalline silicon (μc-Si:H) layer, which is the second conductive semiconductor layer, and an n-type hydrogenated microcrystalline silicon (μc-Si:H) layer, which is the third conductive semiconductor layer.

When the thin-film semiconductor layer 6 is formed by laminating a plurality of thin-film semiconductor layers as in the two-stage P-I-N junction, intermediate layers of microcrystalline silicon oxide (μc-$SiO_x$(X=0 to 2), aluminum-added zinc oxide (ZnO:Al), or the like can be inserted among the P-I-N junction to improve electric and optical connection among the P-I-N junction.

The rear-surface transparent electrode layer 7 is formed of transparent conductive oxide (TCO) such as zinc oxide (ZnO), indium tin oxide (ITO), or tin oxide ($SnO_2$).

The second photoelectric conversion module 8 includes a plurality of photoelectric conversion elements 9a and 9b (hereinafter generally referred to as photoelectric conversion element 9 in some case), which are second photoelectric conversion elements. The photoelectric conversion element 9 is formed by sequentially laminating, on a translucent insulated substrate 10, which is a second translucent insulated substrate, having size substantially equivalent to that of the translucent insulated substrate 4, a reflective metal electrode layer 11 patterned in a stripe shape that has a texture structure (not shown) on a front surface on the opposite side of the translucent insulated substrate 10 and extends in a direction substantially parallel to a latitudinal direction of the translucent insulated substrate 10, a thin-film semiconductor layer 12, which is a second thin-film semiconductor layer, patterned in a stripe shape that extends in the direction substantially parallel to the latitudinal direction of the translucent insulated substrate 10 in shape and arrangement different from those of the reflective metal electrode layer 11, and a rear-surface transparent electrode layer 13, which is a third transparent electrode layer, patterned in a stripe shape that extends in the direction substantially parallel to the latitudinal direction of the translucent insulated substrate 10 in shape and arrangement different from those of the reflective metal electrode layer 11 and the thin-film semiconductor layer 12. In the second photoelectric conversion module 8, the photoelectric conversion elements 9 adjacent to each other are not electrically connected.

In FIG. 1-2, the two photoelectric conversion elements 9a and 9b adjacent to each other of the second photoelectric conversion module 8 are shown. However, the number of photoelectric conversion elements 9 included in the second photoelectric conversion module 8 is not limited to this. A large number of photoelectric conversion elements 9 are formed on the translucent insulated substrate 10.

As the translucent insulated substrate 10, a tabular member or a sheet-like member formed of an insulative material having translucency such as glass or transparent resin is used.

As the reflective metal electrode layer 11, a single layer film of silver (Ag) or a multilayer film in which silver (Ag) and zinc oxide (ZnO) are laminated in this order from the translucent insulated substrate 10 side is used. Aluminum (Al), gold (Au), copper (Cu), platinum (Pt), chrome (Cr), or the like can be used instead of silver (Ag). A transparent conductive film of indium tin oxide (ITO), tin oxide ($SnO_2$), or the like can be used instead of zinc oxide (ZnO). When necessary, an undercoat layer formed of silicon oxide ($SiO_2$) or the like can be formed on the translucent insulated substrate 10 as a layer for blocking impurities from the translucent insulated substrate 10.

The thin-film semiconductor layer 12 is arranged in front of the reflective metal electrode layer 11 viewed from the light incident side, has a P-I-N structure, and is formed by laminating one or more thin-film semiconductor layers that perform power generation using incident light. The thin-film semiconductor layer 12 forms an N-I-P junction including, from the translucent insulated substrate 10 side, an N-type semiconductor layer, which is the third conductive semiconductor layer, an I-type semiconductor layer, which is the substantially intrinsic photoelectric conversion layer and the second conductive semiconductor layer, and a P-type semiconductor layer, which is the first conductive semiconductor layer. In this embodiment, the thin-film semiconductor layer 12 forms an N-I-P junction including, in order from the translucent insulated substrate 10 side, an n-type hydrogenated microcrystalline silicon ($\mu$c-Si:H) layer, which is the third conductive semiconductor layer, an i-type hydrogenated microcrystalline silicon ($\mu$c-Si:H) layer, which is the second conductive semiconductor layer, and a p-type hydrogenated microcrystalline silicon ($\mu$c-Si:H) layer, which is the first conductive semiconductor layer.

The thin-film semiconductor layer 12 can have a configuration of a two-stage P-I-N junction including, from 3C) the translucent insulated substrate 10 side, an n-type hydrogenated microcrystalline silicon ($\mu$c-SiC:H) layer, which is the third conductive semiconductor layer, an i-type hydrogenated microcrystalline silicon ($\mu$c-Si:H) layer, which is the second conductive semiconductor layer, a p-type hydrogenated microcrystalline silicon ($\mu$c-Si:H) layer, which is the first conductive semiconductor layer, an n-type hydrogenated microcrystalline silicon ($\mu$c-Si:H) layer, which is the third conductive semiconductor layer, an i-type hydrogenated amorphous silicon germanium (a-SiGe:H) layer, which is the second conductive semiconductor layer, and a p-type hydrogenated microcrystalline silicon ($\mu$c-Sc:H) layer, which is the first conductive semiconductor layer.

When a plurality of thin-film semiconductor layers are laminated and the thin-film semiconductor layer 12 is configured as in the two-stage N-I-P junction, intermediate layers of microcrystalline silicon oxide ($\mu$c-$SiO_x$(X=0 to 2), aluminum-added zinc oxide (ZnO:Al), or the like can be inserted among the N-I-P junction to improve electric and optical connection among the N-I-P junction.

The rear-surface transparent electrode layer 13 is formed of transparent conductive oxide (TCO) such as zinc oxide (ZnO), indium tin oxide (ITO), or tin oxide ($SnO_2$).

As a combination of the first photoelectric conversion module 2 and the second photoelectric conversion module 8, a lamination form of the thin-film semiconductor layers in the respective modules can be, for example, (1) one-stage pin junction—one-stage nip junction, (2) two-stage pin junction—one-stage nip junction, (3) one-stage pin junction—two-stage nip junction, and (4) two-stage pin junction—two-stage nip junction.

Width in the longitudinal direction of the translucent insulated substrate 4 in the photoelectric conversion element 3 (width in a line segment A-A' direction in FIG. 1-1) and width in a longitudinal direction of the translucent insulated substrate 10 in the photoelectric conversion element 9 (width in the segment A-A' direction in FIG. 1-1) are set the same. In the photoelectric conversion device 1, the photoelectric conversion element 3 and the photoelectric conversion element 9 are arranged in positions opposed to each other to form a pair of the photoelectric conversion element 3 and the photoelectric conversion element 9. In other words, in FIG. 1-2, the photoelectric conversion element 3a and the photoelectric conversion element 9a are arranged in positions opposed to each other to form a photoelectric conversion element pair. The photoelectric conversion element 3b and the photoelectric conversion element 9b are arranged in positions opposed to each other to form a photoelectric conversion element pair. The photoelectric conversion element pairs can be regarded as new photoelectric conversion elements.

As shown in FIG. 1-3, the rear-surface transparent electrode layer 7 of the first photoelectric conversion module 2 and the rear-surface transparent electrode layer 13 of the second photoelectric conversion module 8 are electrically connected by a conductive layer 21 in an outer peripheral region 14 in the latitudinal direction of the translucent insulated substrate 4 (the translucent insulated substrate 10) (a line segment B-B' direction in FIG. 1-1). The conductive layer 21 is formed of conductive resin such as metal paste or an anisotropic conductive film. Consequently, the pair of the photoelectric conversion element 3 and the photoelectric conversion element 9 opposed to each other are electrically connected. Metal included in the conductive resin is desirably any one or more of gold, silver, nickel, and palladium having low contact resistance from which a conductive film is hardly formed. With such a configuration, photoelectric conversion elements opposed to each other are electrically directly connected and have an element configuration same as that of a laminated thin-film photoelectric conversion element formed on the same substrate. All photoelectric conversion element pairs of the photoelectric conversion device 1 of the mechanical stack type have substantially the same characteristics.

A connection region 5$a$ where the thin-film semiconductor layer 6 and the rear-surface transparent electrode layer 7 are not laminated is provided in a region at the other end in the longitudinal direction of the translucent insulated substrate 4 in the photoelectric conversion element 3 (a line segment A-A' direction in FIG. 1-1) on the front surface on the second photoelectric conversion module 8 side in the transparent electrode layer 5 of the photoelectric conversion element 3$b$. On the other hand, a connection region 11$a$ where the thin-film semiconductor layer 12 and the rear-surface transparent electrode layer 13 are not laminated is provided in a region at one end in the longitudinal direction of the translucent insulated substrate 4 in the photoelectric conversion element 9 (the line segment A-A' direction in FIG. 1-1) on the front surface on the first photoelectric conversion module 2 side in the reflective metal electrode layer 11 of the photoelectric conversion element 9$a$.

The connection region 5$a$ of the photoelectric conversion element 3$b$ and the connection region 11$a$ of the photoelectric conversion element 9$a$ adjacent to the photoelectric conversion element 9$b$ opposed to the photoelectric conversion element 3$b$ are electrically connected by the conductive layer 22. The conductive layer 22 is formed of conductive resin such as metal paste or an anisotropic conductive film. Consequently, the transparent electrode layer 5 of the photoelectric conversion element 3 and reflective metal electrode layer 11 of the photoelectric conversion element 9 adjacent to and forming a pair with the photoelectric conversion element 3 are electrically connected. Metal included in the conductive resin is desirably any one or more of gold, silver, nickel, and palladium having low contact resistance from which a conductive film is hardly formed. With such a configuration, photoelectric conversion elements adjacent to each other are electrically directly connected and have an element configuration same as a configuration in which a laminated thin-film photoelectric conversion element formed on the same substrate is connected in series.

FIG. 2 is an equivalent circuit diagram of the photoelectric conversion device 1 of the mechanical stack type according to the first embodiment. As shown in FIG. 2, in the photoelectric conversion device 1, all the photoelectric conversion elements 3 and all the photoelectric conversion elements 9 are alternately connected in series. As in the laminated thin-film photoelectric conversion device, the photoelectric conversion elements 3 and 9 operate at optimum operating points and power generation efficiency is improved. Consequently, in the photoelectric conversion device 1, photoelectric conversion efficiency equivalent to that of the laminated thin-film photoelectric conversion device can be realized.

Figure 4:
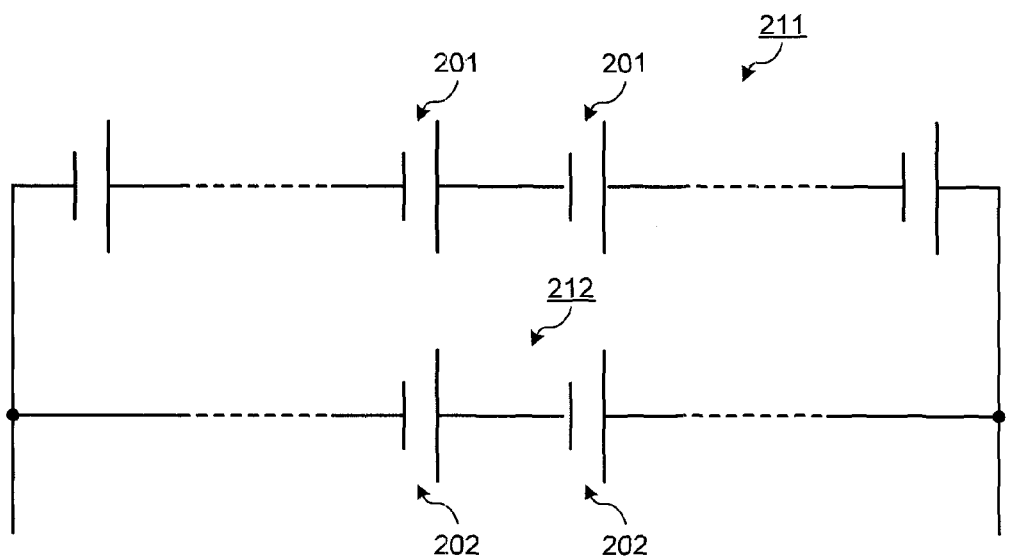
FIG. 4 is an equivalent circuit diagram of a photoelectric conversion device of the mechanical stack type in the past.

FIGS. 3 and 4 are equivalent circuit diagrams of a photoelectric conversion device of a mechanical stack type in the past. The photoelectric conversion device shown in FIGS. 3 and 4 are a photoelectric conversion device of the mechanical stack type in which a first photoelectric conversion module 211, in which a plurality of photoelectric conversion elements 201 are formed, and a second photoelectric conversion module 212, in which a plurality of photoelectric conversion elements 202 are formed, are configured by arranging the elements to be opposed to each other. In general, power generation characteristics of the photoelectric conversion elements 201 and the photoelectric conversion elements 202 in the photoelectric conversion device of the mechanical stack type are different. Therefore, the photoelectric conversion device of the mechanical stack type in the past adopts a method of independently extracting outputs from the respective modules as shown in FIGS. 3 and 4 or changing the number of series stages of the photoelectric conversion elements such that output voltages are substantially equal. In FIG. 3, a photoelectric conversion device of a mechanical stack type of a system for independently extracting outputs from the respective modules is shown. In FIG. 4, a photoelectric conversion device of a mechanical stack type of a system for changing the number of series stages of the photoelectric conversion elements for each of the modules such that output voltages are substantially equal is shown.

However, in the case of the system for independently extracting outputs from the respective modules, output extracting sections are necessary in the respective modules, member costs increase, and the structure of the output extracting sections is complicated. In the case of the system for changing the number of series stages of the photoelectric conversion elements for each of the modules, the structure of output extracting sections that extract outputs from both the modules is complicated. The numbers of series stages of photoelectric conversion elements formed in modules of the same size and connected in series are different in two modules. Therefore, performance equivalent to that of the laminated thin-film photoelectric conversion device having the same numbers of photoelectric conversion elements cannot be realized. Power generation efficiency of an entire stack module is deteriorated.

On the other hand, in the photoelectric conversion device 1 of the mechanical stack type according to the first embodiment, the photoelectric conversion element 3 and the photoelectric conversion element 9 opposed to each other are electrically connected and the photoelectric conversion element 3 and the photoelectric conversion element 9 adjacent to and forming the photoelectric conversion element pair with the photoelectric conversion element 3 are electrically connected. Consequently, all the photoelectric conversion elements 3 and all the photoelectric conversion elements 9 are alternately connected in series. The photoelectric conversion device 1 has a configuration equivalent to that of the laminated thin-film photoelectric conversion device. The photoelectric conversion elements 3 and 9 operate at optimum operating points and power generation efficiency is improved.

Figures 1, 5:
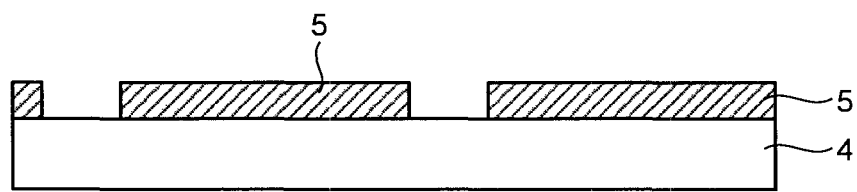
Figures 2, 5:
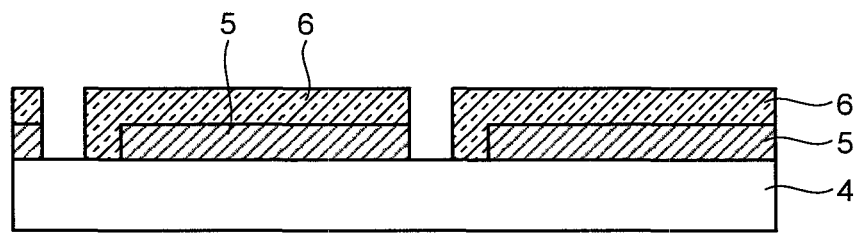
Figures 3, 5:
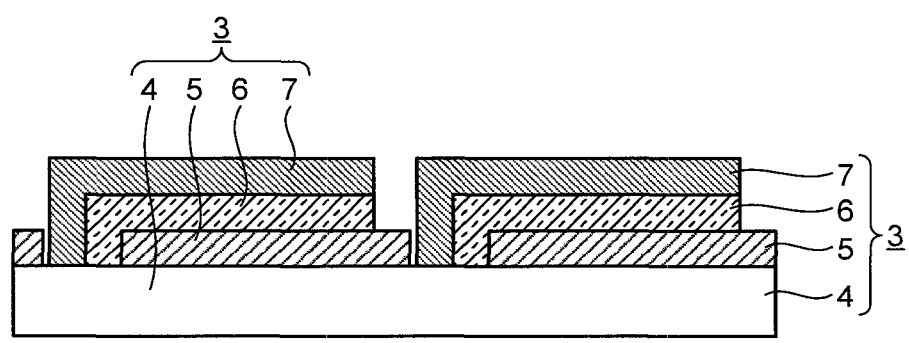
Figures 4, 5:
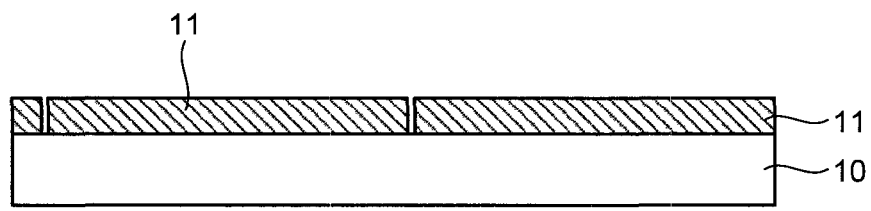
Figure 5:
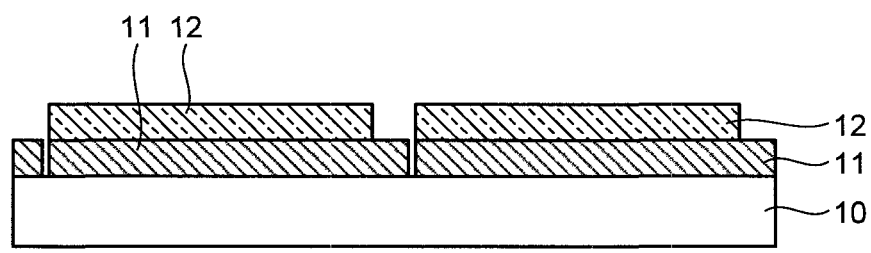
Figures 5, 6:
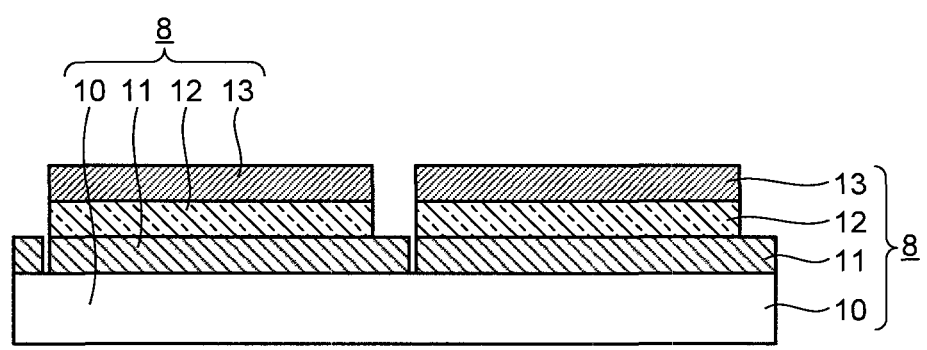
Figures 1, 6:
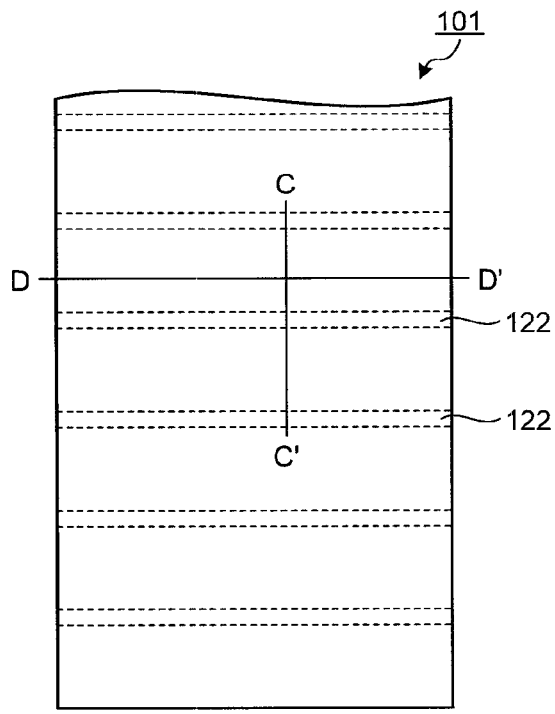
Figures 2, 6:
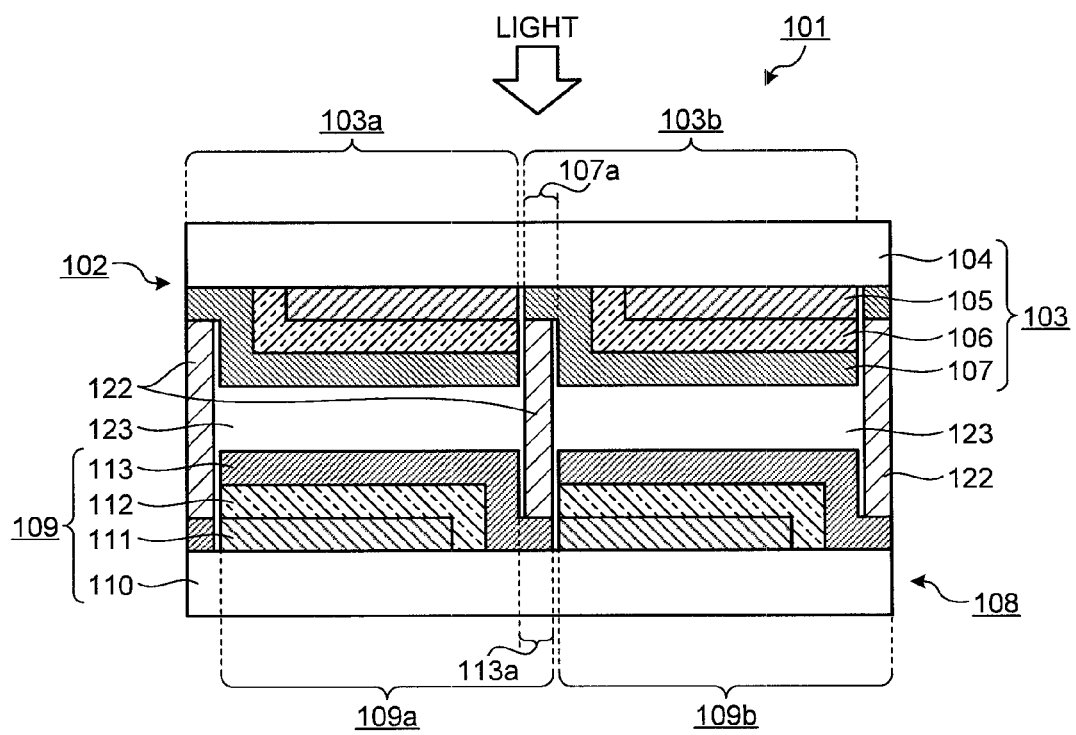
Figures 3, 6:
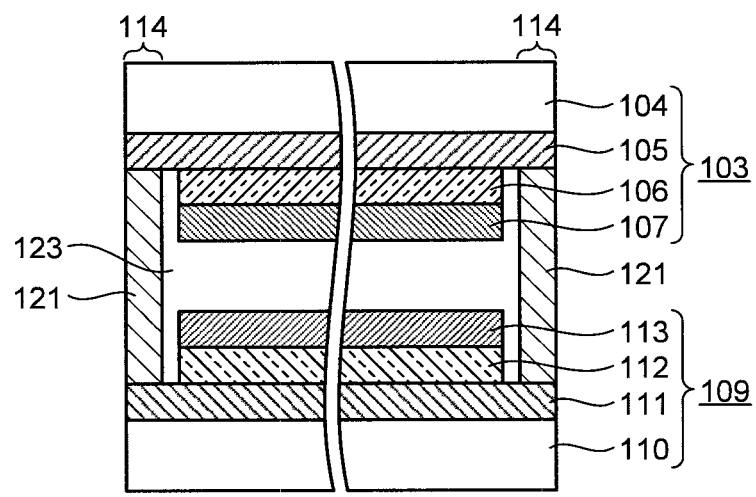

A method of manufacturing such a photoelectric conversion device 1 of the mechanical stack type according to the first embodiment is explained with reference to FIGS. 5-1 to 5-6. FIGS. 5-1 to 5-6 are sectional views for explaining a manufacturing process for the photoelectric conversion device 1 of the mechanical stack type according to the first embodiment.

First, the first photoelectric conversion module 2 is manufactured. In the first place, for example, a glass substrate of a flat plate shape is prepared as the translucent insulated substrate 4. The transparent electrode layer 5 formed of a transparent conductive oxide (TCO) such as tin oxide ($SnO_2$), zinc oxide (ZnO), or indium oxide ($In_2O_3$) having an uneven texture structure on the surface thereof is formed on one surface side of the translucent insulated substrate 4.

Subsequently, a part of the transparent electrode layer 5 is cut and removed in a stripe shape in the direction substantially parallel to the latitudinal direction of the translucent insulated substrate 4 by laser irradiation to pattern the transparent electrode layer 5 in a stripe shape and separate the transparent electrode layer 5 into a plurality of transparent electrode layers 5 (FIG. 5-1).

The thin-film semiconductor layer 6 for photoelectric conversion formed of, for example, amorphous silicon is formed on the transparent electrode layers 5 by a plasma CVD method or the like. As the thin-film semiconductor layer 6, a p-type hydrogenated amorphous silicon carbide (a-SiC:H) layer, which is the first conductive semiconductor layer, an i-type hydrogenated amorphous silicon (a-Si:H) layer, which is the second conductive semiconductor layer, and an n-type hydrogenated amorphous silicon (a-Si:H) layer, which is the third conductive semiconductor layer, are sequentially formed from the translucent insulated substrate 4 side. In places in a part of positions where the transparent electrode layers 5 are cut, a part of the thin-film semiconductor layer 6 is cut and removed in a stripe shape in the direction substantially parallel to the latitudinal direction of the translucent insulated substrate 4 to pattern the thin-film semiconductor layer 6 in a stripe shape and separate the thin-film semiconductor layer 6 into a plurality of thin-film semiconductor layers 6 (FIG. 5-2).

The rear-surface transparent electrode layer 7 formed of a transparent conductive oxide (TCO) such as tin oxide ($SnO_2$), zinc oxide (ZnO), or indium oxide ($In_2O_3$) is formed on the thin-film semiconductor layers 6 by a sputtering method or the like. The rear-surface transparent electrode layer 7 and the thin-film semiconductor layers 6 are cut and removed by laser irradiation in places where the transparent electrode layers 5 and the thin-film semiconductor layers 6 are cut and places adjacent to the places to pattern the rear-surface transparent electrode layer 7 in a stripe shape and separate the rear-surface transparent electrode layer 7 into a plurality of rear-surface transparent electrode layers 7 (FIG. 5-3). Consequently, the layers are separated for each of the photoelectric conversion elements 3 and the first photoelectric conversion module 2 is obtained.

Next, the second photoelectric conversion module 8 is manufactured. In the first place, for example, a glass substrate of a flat plate shape is prepared as the translucent insulated substrate 10. The reflective metal electrode layer 11 formed of a light-reflecting metal layer of silver (Ag) or the like having an uneven texture structure on the surface thereof is formed on one surface side of the translucent insulated substrate 10.

Subsequently, a part of the reflective metal electrode layer 11 is cut and removed in a stripe shape in the direction substantially parallel to the latitudinal direction of the translucent insulated substrate 10 by laser irradiation to pattern the reflective metal electrode layer 11 in a stripe shape and separate the reflective metal electrode layer 11 into a plurality of reflective metal electrode layers 11 (FIG. 5-4).

The thin-film semiconductor layer 12 for photoelectric conversion formed of, for example, hydrogenated microcrystalline silicon is formed on the reflective metal electrode layers 11 by the plasma CVD method or the like. As the thin-film semiconductor layer 12, an n-type hydrogenated microcrystalline silicon (μc-Si:H) layer, which is the third conductive semiconductor layer, an i-type hydrogenated microcrystalline silicon (μc-Si:H) layer, which is the second conductive semiconductor layer, and a p-type hydrogenated microcrystalline silicon (μc-Si:H) layer, which is the first conductive semiconductor layer, are sequentially formed from the translucent insulated substrate 10 side. A part of the thin-film semiconductor layer 12 is cut and removed in a stripe shape in the direction substantially parallel to the latitudinal direction of the translucent insulated substrate 10 by laser irradiation in places where the reflective metal electrode layers 11 are cut or places adjacent to the places to pattern the thin-film semiconductor layer 12 in a stripe shape and separate the thin-film semiconductor layer 12 into a plurality of thin-film semiconductor layers 12 (FIG. 5-5).

The rear-surface transparent electrode layer 13 formed of a transparent conductive oxide (TCO) such as tin oxide ($SnO_2$), zinc oxide (ZnO), or indium oxide ($In_2O_3$) is formed on the thin-film semiconductor layers 12 by the sputtering method or the like. The rear-surface transparent electrode layer 13 is cut and removed by laser irradiation in places same as positions of the cutting of the thin-film semiconductor layers 12 to pattern the rear-surface transparent electrode layer 13 in a stripe shape and separate the rear-surface transparent electrode layer 13 into a plurality of rear-surface transparent electrode layers 13 (FIG. 5-6). Consequently, the layers are separated for each of the photoelectric conversion elements 9 and the second photoelectric conversion module 8 is obtained.

A light transmissive resin layer is formed as the intermediate layer 23 over the entire surface on the photoelectric conversion element 9 in the second photoelectric conversion module 8. In the light transmissive resin layer, a contact hole is opened in a place where the photoelectric conversion element 3 and the photoelectric conversion element 9 are electrically connected, i.e., a place where the conductive layer 21 and the conductive layer 22 are formed. Thereafter, conductive paste or a conductive film is filled in the contact hole by a method such as application or printing to form the conductive layer 21 and the conductive layer 22.

The first photoelectric conversion module 2 is arranged on the intermediate layer 23 such that the photoelectric conversion element 3 and the photoelectric conversion element 9 forming a pair are opposed to each other. The first photoelectric module 2 and the second photoelectric module 8 are bonded together with the photoelectric conversion element 3 and the photoelectric conversion element 9 placed on the inner side and are heated and pressed, for example, in vacuum. Consequently, first photoelectric conversion module 2 and the second photoelectric conversion module 8 are integrated. The rear-surface transparent electrode layer 7 of the first photoelectric conversion module 2 and the rear-surface transparent electrode layer 13 of the second photoelectric conversion module 8 are electrically connected by the conductive layer 21. The transparent electrode layer 5 of the photoelectric conversion element 3 and the reflective metal electrode layer 11 of the photoelectric conversion element 9 adjacent to the photoelectric conversion element 9 opposed to the photoelectric conversion element 3 are electrically connected by the conductive layer 22. The photoelectric conversion device 1 of the mechanical stack type shown in FIGS. 1-1 to 1-3 is obtained. Thereafter, one output extracting section (not shown) is formed in each of only photoelectric conversion elements at both ends among a plurality of photoelectric conversion elements connected in series.

As explained above, in the photoelectric conversion device 1 of the mechanical stack type according to the first embodiment, the photoelectric conversion element pairs opposed to each other are electrically connected and the photoelectric conversion element 3 and the photoelectric conversion element 9 adjacent to and forming a pair with the photoelectric conversion element 3 are electrically connected. Consequently, all the photoelectric conversion elements 3 and all the photoelectric conversion elements 9 are alternately connected in series as indicated by the equivalent circuit shown in FIG. 2. Therefore, because the photoelectric conversion device 1 of the mechanical stack type according to the first embodiment has a connection configuration equivalent to that of the laminated thin-film photoelectric conversion device, the photoelectric conversion elements 3 and 9 operate at optimum operating points and power generation efficiency is improved. As a result, the photoelectric conversion device 1 of the mechanical stack type according to the first embodiment has an unprecedented remarkable effect that photoelectric conversion efficiency equivalent to that of the laminated thin-film photoelectric conversion device can be realized by the photoelectric conversion device of the mechanical stack type.

In the photoelectric conversion device 1 of the mechanical stack type according to the first embodiment, the photoelectric conversion element pairs are connected in series in a configuration equivalent to that of the laminated thin-film photoelectric conversion device. Therefore, the output extracting sections necessary for the respective two photoelectric conversion modules in the past are consolidated in a single place (not shown). In other words, the output extracting section only has to be provided in one place only in each of photoelectric conversion elements at both ends among a plurality of photoelectric conversion elements connected in series. Consequently, because the configuration of the photoelectric conversion device 1 is simplified, the photoelectric conversion device 1 is excellent in durability, a manufacturing process can be simplified, and members used for the output extracting section can be reduced. Therefore, a reduction in cost is possible.

As explained above, with the method of manufacturing the photoelectric conversion device 1 of the mechanical stack type according to the first embodiment, the photoelectric conversion element pairs opposed to each other are electrically connected and the photoelectric conversion element 3 and the photoelectric conversion element 9 adjacent to and forming a pair with the photoelectric conversion element 3 are electrically connected. Consequently, all the photoelectric conversion elements 3 and all the photoelectric conversion elements 9 are alternately connected in series. Therefore, with the method of manufacturing the photoelectric conversion device 1 of the mechanical stack type according to the first embodiment, it is possible to realize a photoelectric conversion device of a mechanical stack type in which the photoelectric conversion element pairs are connected in series and that has a configuration equivalent to that of the laminated thin-film photoelectric conversion device and has photoelectric conversion efficiency equivalent to that of the laminated thin-film photoelectric conversion device.

With the method of manufacturing the photoelectric conversion device 1 of the mechanical stack type according to the first embodiment, the photoelectric conversion element pairs are connected in series in a configuration equivalent to that of the laminated thin-film photoelectric conversion device. Therefore, the output extracting sections necessary for the respective two photoelectric conversion modules in the past are consolidated in a single place. In other words, the output extracting section only has to be provided in one place only in each of photoelectric conversion elements at both ends among a plurality of photoelectric conversion elements connected in series. Consequently, a manufacturing process can be simplified and members used for the output extracting section can be reduced. Therefore, a reduction in cost is possible.

Second Embodiment

FIG. 6-1 is a plan view of a schematic configuration of a photoelectric conversion device 101 of a mechanical stack type according to a second embodiment of the present invention. FIG. 6-2 is a diagram for explaining a sectional structure of the photoelectric conversion device 101 and is a main part sectional view in a line segment C-C' direction of FIG. 6-1. FIG. 6-3 is a diagram for explaining a sectional structure of the photoelectric conversion device 101 and is a main part sectional view in a line segment D-D' direction of FIG. 6-1.

The photoelectric conversion device 101 of the mechanical stack type according to the second embodiment includes a first photoelectric conversion module 102 and a second photoelectric conversion module 108, which are two thin-film photoelectric conversion modules in each of which a plurality of photoelectric conversion elements are formed on a translucent insulated substrate. Light is made incident from the first photoelectric conversion module 102 side. An intermediate layer 123 held between the first photoelectric conversion module 102 and the second photoelectric conversion module 108 is formed of light transmissive resin or a selective light reflecting film having wavelength selectivity.

The first photoelectric conversion module 102 includes a plurality of photoelectric conversion elements 103a and 103b (hereinafter generally referred to as photoelectric conversion element 103 in some case). The photoelectric conversion element 103 is formed by sequentially laminating, on a translucent insulated substrate 104, a transparent electrode layer 105 patterned in a stripe shape that has a texture structure (not shown) on a front surface on the opposite side of the translucent insulated substrate 104 and extends in a direction substantially parallel to a latitudinal direction of the translucent insulated substrate 104, a thin-film semiconductor layer 106 patterned in a stripe shape that extends in the direction substantially parallel to the latitudinal direction of the translucent insulated substrate 104 in shape and arrangement different from those of the transparent electrode layer 105, and a rear-surface transparent electrode layer 107 patterned in a stripe shape that extends in the direction substantially parallel to the latitudinal direction of the translucent insulated substrate 104 in shape and arrangement different from those of the transparent electrode layer 105 and the thin-film semiconductor layer 106. In the first photoelectric conversion module 102, the photoelectric conversion elements 103 adjacent to each other are not electrically connected.

The thin-film semiconductor layer 106 is provided in a general L-shape to cover the transparent electrode layer 105 and to be connected to the translucent insulated substrate 104 at one end in a longitudinal direction of the translucent insulated substrate 104 in the transparent electrode layer 105. The rear-surface transparent electrode layer 107 is provided in a substantial crank shape to cover the thin-film semiconductor layer 106 and to be connected to the translucent insulated substrate 104 at one end in the longitudinal direction of the translucent insulated substrate 104 in the transparent electrode layer 105.

In FIG. 6-2, the two photoelectric conversion elements 103a and 103b adjacent to each other of the first photoelectric conversion module 102 are shown. However, the number of photoelectric conversion elements 103 included in the first photoelectric conversion module 102 is not limited to this. A large number of photoelectric conversion elements 103 are formed on the translucent insulated substrate 104.

The second photoelectric conversion module 108 includes a plurality of photoelectric conversion elements 109a and 109b (hereinafter generally referred to as photoelectric conversion element 109 in some case). The photoelectric conversion element 109 is formed by sequentially laminating, on a translucent insulated substrate 110 having size substantially equivalent to that of the translucent insulated substrate 104, a reflective metal electrode layer 111 patterned in a stripe shape that has a texture structure (not shown) on a front surface on the opposite side of the translucent insulated substrate 110 and extends in a direction substantially parallel to a latitudinal direction of the translucent insulated substrate 110, a thin-film semiconductor layer 12 patterned in a stripe shape that extends in the direction substantially parallel to the latitudinal direction of the translucent insulated substrate 110 in shape and arrangement different from those of the reflective metal electrode layer 111, and a rear-surface transparent electrode layer 113 patterned in a stripe shape that extends in the direction substantially parallel to the latitudinal direction of the translucent insulated substrate 110 in shape and arrangement different from those of the reflective metal electrode layer 111 and the thin-film semiconductor layer 112. In the second photoelectric conversion module 108, the photoelectric conversion elements 109 adjacent to each other are not electrically connected.

In FIG. 6-2, the two photoelectric conversion elements 109a and 109b adjacent to each other of the second photoelectric conversion module 108 are shown. However, the number of photoelectric conversion elements 109 included in the second photoelectric conversion module 108 is not limited to this. A large number of photoelectric conversion elements 109 are formed on the translucent insulated substrate 110.

Details of the members included in the first photoelectric conversion module 102 and the second photoelectric conversion module 108 are the same as those of the first photoelectric conversion module 2 and the second photoelectric conversion module 8 in the first embodiment. Therefore, detailed explanation of the members is omitted.

Width in the longitudinal direction of the translucent insulated substrate 104 in the photoelectric conversion element 103 (width in a line segment C-C' direction in FIG. 6-1) and width in a longitudinal direction of the translucent insulated substrate 110 in the photoelectric conversion element 109 (width in the segment C-C' direction in FIG. 6-1) are set the same. In the photoelectric conversion device 101, the photoelectric conversion element 103 and the photoelectric conversion element 109 are arranged in positions opposed to each other to form a pair of the photoelectric conversion element 103 and the photoelectric conversion element 109. In other words, in FIG. 6-2, the photoelectric conversion element 103a and the photoelectric conversion element 109a are arranged in positions opposed to each other to form a photoelectric conversion element pair. The photoelectric conversion element 103b and the photoelectric conversion element 109b are arranged in positions opposed to each other to form a photoelectric conversion element pair. The photoelectric conversion element pairs can be regarded as new photoelectric conversion elements.

As shown in FIG. 6-3, the transparent electrode layer 105 of the first photoelectric conversion module 102 and the reflective metal electrode layer 111 of the second photoelectric conversion module 108 are electrically connected by a conductive layer 121 in an outer peripheral region 114 in the latitudinal direction of the translucent insulated substrate 104 (the translucent insulated substrate 110) (a line segment D-D' direction in FIG. 6-1). The conductive layer 121 is formed of conductive resin such as metal paste or an anisotropic conductive film. Consequently, the pair of the photoelectric conversion element 103 and the photoelectric conversion element 109 opposed to each other are electrically connected. Metal included in the conductive resin is desirably any one or more of gold, silver, nickel, and palladium having low contact resistance from which a conductive film is hardly formed.

With such a configuration, photoelectric conversion elements opposed to each other are electrically directly connected and have an element configuration same as that of a laminated thin-film photoelectric conversion element formed on the same substrate. All photoelectric conversion element pairs of the photoelectric conversion device 101 of the mechanical stack type have substantially the same characteristics.

A connection region 107a is provided in a region at the other end in the longitudinal direction of the translucent insulated substrate 104 in the photoelectric conversion element 103 (a line segment C-C' direction in FIG. 6-1) on the front surface on the second photoelectric conversion module 108 side in the rear-surface transparent electrode layer 107 of the first photoelectric conversion module 102. On the other hand, a connection region 113a is provided in a region at one end in the longitudinal direction of the translucent insulated substrate 110 in the photoelectric conversion element 109 (the line segment C-C' direction in FIG. 6-1) on the front surface on the first photoelectric conversion module 102 side in the rear-surface transparent electrode layer 113 of the second photoelectric conversion module 108.

The connection region 107a of the photoelectric conversion element 103b and the connection region 113a of the photoelectric conversion element 109a adjacent to the photoelectric conversion element 109b opposed to the photoelectric conversion element 103b are electrically connected by the conductive layer 122. The conductive layer 122 is formed of conductive resin such as metal paste or an anisotropic conductive film. Consequently, the rear-surface transparent electrode layer 107 of the photoelectric conversion element 103 and rear-surface transparent electrode layer 113 of the photoelectric conversion element 109 adjacent to and forming a pair with the photoelectric conversion element 103 are electrically connected. Metal included in the conductive resin is desirably any one or more of gold, silver, nickel, and palladium having low contact resistance from which a conductive film is hardly formed. With such a configuration, photoelectric conversion elements adjacent to each other are electrically directly connected and have an element configuration same as a configuration in which a laminated thin-film photoelectric conversion element is formed on the same substrate.

In the photoelectric conversion device 101 of the mechanical stack type according to the second embodiment configured as explained above, as in the photoelectric conversion device 1 of the mechanical stack type according to the first embodiment, photoelectric conversion element pairs opposed to each other are electrically connected and the photoelectric conversion element 103 and the photoelectric conversion element 109 adjacent to and forming a pair with the photoelectric conversion element 103 are electrically connected, whereby all the photoelectric conversion elements 103 and all the photoelectric conversion elements 109 are alternately connected in series. Consequently, the photoelectric conversion device 101 of the mechanical stack type according to the second embodiment has a connection configuration equivalent to that of the laminated thin-film photoelectric conversion device. Therefore, the photoelectric conversion elements 103 and 109 operate at optimum operating points and power generation efficiency is improved. As a result, the photoelectric conversion device 101 of the mechanical stack type according to the second embodiment has an unprecedented remarkable effect that photoelectric conversion efficiency equivalent to that of the laminated thin-film photoelectric conversion device can be realized by the photoelectric conversion device of the mechanical stack type.

In the photoelectric conversion device 101 of the mechanical stack type according to the second embodiment, as in the photoelectric conversion device 1 of the mechanical stack type according to the first embodiment, the photoelectric conversion element pairs are connected in series in a configuration equivalent to that of the laminated thin-film photoelectric conversion device. Therefore, the output extracting sections necessary for the respective two photoelectric conversion modules in the past are consolidated in a single place (not shown). In other words, the output extracting section only has to be provided in one place only in each of photoelectric conversion elements at both ends among a plurality of photoelectric conversion elements connected in series. Consequently, because the configuration of the photoelectric conversion device 101 is simplified, a manufacturing process can be simplified and members used for the output extracting section can be reduced. Therefore, a reduction in cost is possible.

Third Embodiment

Figures 1, 7:
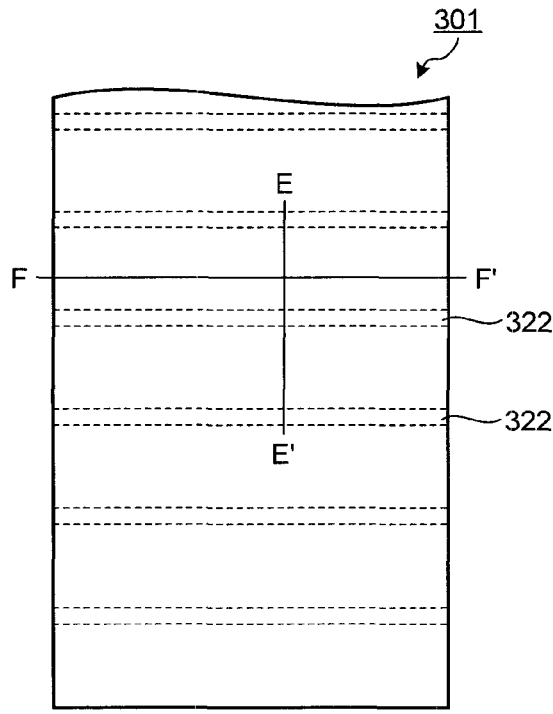
Figures 2, 7:
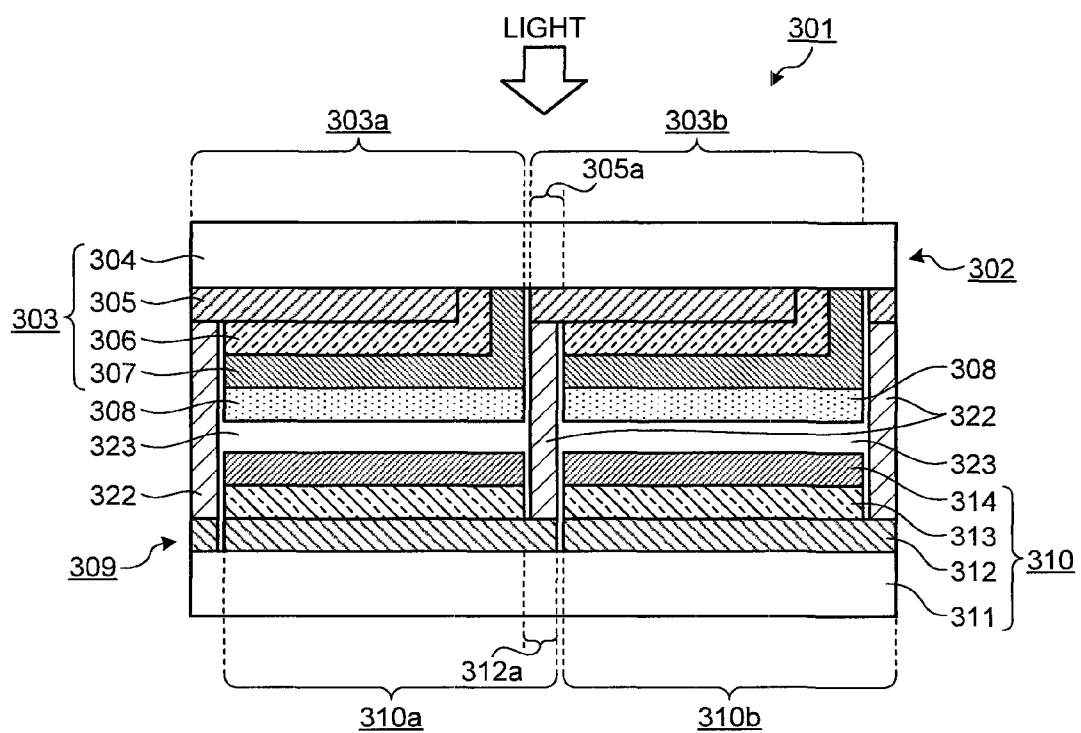
Figures 3, 7:
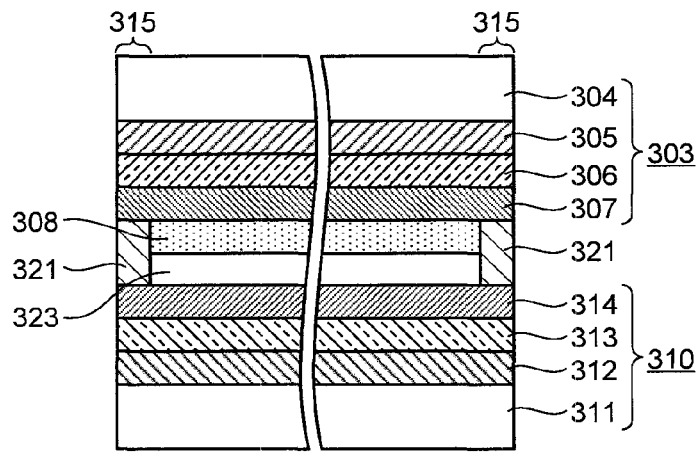
Figures 4, 7:
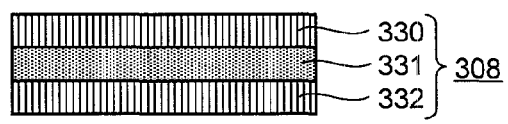
Figures 5, 7:
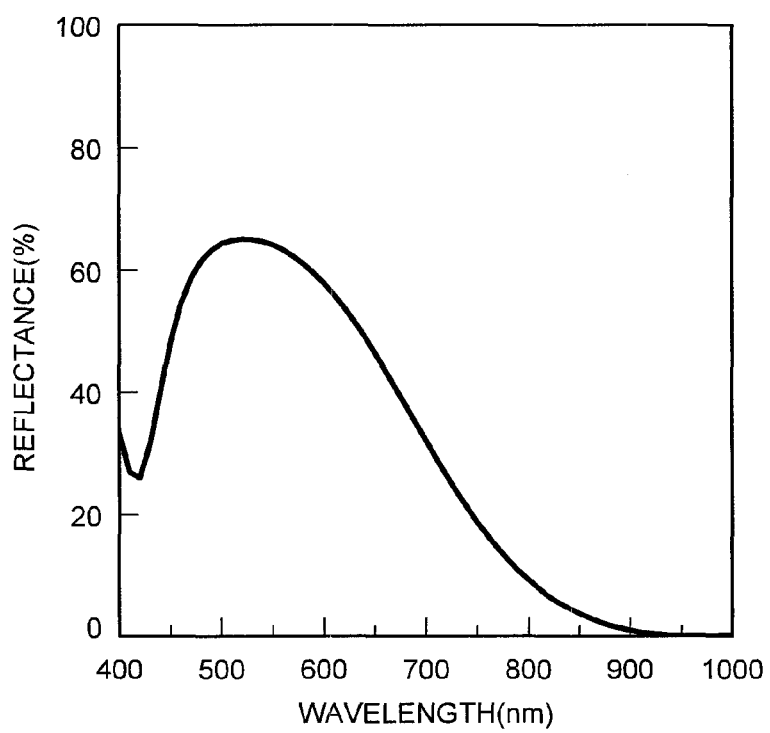

FIG. 7-1 is a plan view of a schematic configuration of a photoelectric conversion device 301 of a mechanical stack type according to a third embodiment of the present invention. FIG. 7-2 is a diagram for explaining a sectional structure of the photoelectric conversion device 301 and is a main part sectional view in a line segment E-E' direction of FIG. 7-1. FIG. 7-3 is a diagram for explaining a sectional structure of the photoelectric conversion device 301 and is a main part sectional view in a line segment F-F' direction of FIG. 7-1.

The photoelectric conversion device 301 of the mechanical stack type according to the third embodiment has a configuration in which a first photoelectric conversion module 302 and a second photoelectric conversion module 309, which are two thin-film photoelectric conversion modules in each of which a plurality of photoelectric conversion elements are formed on a translucent insulated substrate, are bonded together with the photoelectric conversion elements placed on the inner side. Light is made incident from the first photoelectric conversion module 302 side. An intermediate layer 323 held between the first photoelectric conversion module 302 and the second photoelectric conversion module 309 is formed of light transmissive resin.

The first photoelectric conversion module 302 includes a plurality of photoelectric conversion elements 303a and 303b (hereinafter generally referred to as photoelectric conversion element 303 in some case), which are first photoelectric conversion elements. The photoelectric conversion element 303 is formed by sequentially laminating, on a translucent insulated substrate 304, which is a first translucent insulated substrate, a transparent electrode layer 305, which is a first transparent electrode layer, patterned in a stripe shape that has a texture structure (not shown) on a front surface on the opposite side of the translucent insulated substrate 304 and extends in a direction substantially parallel to a latitudinal direction of the translucent insulated substrate 304, a thin-film semiconductor layer 306, which is a first thin-film semiconductor layer, patterned in a stripe shape that extends in the direction substantially parallel to the latitudinal direction of the translucent insulated substrate 304 in shape and arrangement different from those of the transparent electrode layer 305, a rear-surface transparent electrode layer 307, which is a second transparent electrode layer, patterned in a stripe shape that extends in the direction substantially parallel to the latitudinal direction of the 2C) translucent insulated substrate 304 in shape and arrangement different from those of the transparent electrode layer 305 and the thin-film semiconductor layer 306, and a wavelength selective reflection layer 308 patterned in a stripe shape extending in the direction substantially parallel to the latitudinal direction of the translucent insulated substrate 304 in shape and arrangement same as those of the rear-surface transparent electrode layer 3. In the first photoelectric conversion module 302, the photoelectric conversion elements 303 adjacent to each other are not electrically connected.

The thin-film semiconductor layer 306 has a cross section of a general L-shape to cover a most part on the second photoelectric conversion module 309 side of the transparent electrode layer 305 and to be connected to the translucent insulated substrate 304 at one end in a longitudinal direction of the translucent insulated substrate 304 in the transparent electrode layer 305. The rear-surface transparent electrode layer 307 has a cross section of a general L-shape to cover the entire part on the photoelectric conversion module 309 side of the thin-film semiconductor layer 306 and to be connected to the translucent insulated substrate 304 at one end in the longitudinal direction of the translucent insulated substrate 304 in the transparent electrode layer 305.

In FIG. 7-2, the two photoelectric conversion elements 303a and 303b adjacent to each other of the first photoelectric conversion module 302 are shown. However, the number of photoelectric conversion elements 303 included in the first photoelectric conversion module 302 is not limited to this. A large number of photoelectric conversion elements 303 are formed on the translucent insulated substrate 304.

In the photoelectric conversion device 301 of the mechanical stack type, because light is made incident from the first photoelectric conversion module 302 side, as the translucent insulated substrate 304, a tabular member or a sheet-like member formed of an insulative material having translucency such as glass or transparent resin is used.

In the transparent electrode layer 305, a transparent conductive oxide (TCO) such as tin oxide ($SnO_2$), zinc oxide (ZnO), or indium oxide ($In_2O_3$) is used as a transparent conductive film having light transmissivity. The transparent electrode layer 305 is formed using a method such as a CVD (Chemical Vapor Deposition) method, a sputtering method, or a vapor deposition method. The transparent electrode layer 305 has a front-surface texture structure (not shown) in which an uneven shape is formed on the surface on the opposite side of the translucent insulated substrate 304. This texture structure has a function of scattering incident sunlight, causing the first photoelectric conversion module 302 and the second photoelectric conversion module 309 to more efficiently absorb the incident light, and improving light use efficiency. When necessary, an undercoat layer formed of silicon oxide ($SiO_2$) or the like can be formed on the translucent insulated substrate 304 as a layer for blocking impurities from the translucent insulated substrate 304.

The thin-film semiconductor layer 306 is arranged behind the transparent electrode layer 305 viewed from the light incident side, has a P-I-N structure, and is formed by laminating one or more thin-film semiconductor layers that perform power generation using incident light. The thin-film semiconductor layer 306 forms a PIN junction including, from the translucent insulated substrate 304 side, a P-type semiconductor layer, which is a first conductive semiconductor layer, an I-type semiconductor layer, which is a substantially intrinsic photoelectric conversion layer and is a second conductive semiconductor layer, and an N-type semiconductor layer, which is a third conductive semiconductor layer. In this embodiment, the thin-film semiconductor layer 306 forms a P-I-N junction including, in order from the translucent insulated substrate 304 side, a p-type hydrogenated amorphous silicon carbide (a-SiC:H) layer, which is the first conductive semiconductor layer, an i-type hydrogenated amorphous silicon (a-Si:H) layer, which is the second conductive semiconductor layer, and an n-type hydrogenated amorphous silicon (a-Si:H) layer, which is the third conductive semiconductor layer.

The thin-film semiconductor layer 306 can have a configuration of a two-stage P-I-N junction including, from the translucent insulated substrate 304 side, a p-type hydrogenated amorphous silicon carbide (a-SiC:H) layer, which is the first conductive semiconductor layer, an i-type hydrogenated amorphous silicon (a-Si:H) layer, which is the second conductive semiconductor layer, an n-type hydrogenated microcrystalline silicon (μc-Si:H) layer, which is the third conductive semiconductor layer, a p-type hydrogenated microcrystalline silicon (μc-Si:H) layer, which is the first conductive semiconductor layer, an i-type hydrogenated microcrystalline silicon (μc-Si:H) layer, which is the second conductive semiconductor layer, and an n-type hydrogenated microcrystalline silicon (μc-Si:H) layer, which is the third conductive semiconductor layer.

When the thin-film semiconductor layer 6 is formed by laminating a plurality of thin-film semiconductor layers as in the two-stage P-I-N junction, intermediate layers of microcrystalline silicon oxide (μc-SiO$_x$(X=0 to 2), aluminum-added zinc oxide (ZnO:Al), or the like can be inserted among the P-I-N junction to improve electric and optical connection among the P-I-N junction.

The rear-surface transparent electrode layer 307 is formed of transparent conductive oxide (TCO) such as zinc oxide (ZnO), indium tin oxide (ITO), or tin oxide (SnO$_2$).

The wavelength selective reflective layer 308 having waveform selectivity for reflecting only light having wavelength in a specific range is arranged on the rear-surface transparent electrode layer 307 and formed of a multilayer structure of films having different indexes of refraction. For example, when the second conductive semiconductor layer of the thin-film semiconductor layer 306 is formed of an i-type a-Si:H layer, the wavelength selective reflection layer 308 is formed of a laminated structure of a first reflection layer 330 having an index of refraction of about 2, a second reflection layer 331 having an index of refraction of about 4, and a third reflection layer 332 having an index of refraction of about 2 (FIG. 7-4). Because of a multiple interference effect of a multilayer film, the wavelength selective reflection layer 308 in this case reflects wavelength light absorbed by the thin-film semiconductor layer 306 and transmits wavelength light hardly absorbed by the thin-film semiconductor layer 306 (FIG. 7-5). The wavelength light absorbed by the thin-film semiconductor layer 306 is, for example, light having wavelength in a range of 300 nm to 700 nm.

The second photoelectric conversion module 309 includes a plurality of photoelectric conversion elements 310$a$ and 310$b$ (hereinafter generally referred to as photoelectric conversion element 310 in some case), which are second photoelectric conversion elements. The photoelectric conversion element 310 is formed by sequentially laminating, on a translucent insulated substrate 311, which is a second translucent insulated substrate having size substantially equivalent to that of the translucent insulated substrate 304, a reflective metal electrode layer 312 patterned in a stripe shape that has a texture structure (not shown) on a front surface on the opposite side of the translucent insulated substrate 311 and extends in a direction substantially parallel to a latitudinal direction of the translucent insulated substrate 311, a thin-film semiconductor layer 313, which is a second thin-film semiconductor layer, patterned in a stripe shape that extends in the direction substantially parallel to the latitudinal direction of the translucent insulated substrate 311 in shape and arrangement different from those of the reflective metal electrode layer 312, and a rear-surface transparent electrode layer 314, which is a third transparent electrode layer, patterned in a stripe shape that extends in the direction substantially parallel to the latitudinal direction of the translucent insulated substrate 311 in shape and arrangement different from those of the reflective metal electrode layer 312 and the thin-film semiconductor layer 313. In the second photoelectric conversion module 309, the photoelectric conversion elements 310 adjacent to each other are not electrically connected.

In FIG. 7-2, the two photoelectric conversion elements 310$a$ and 310$b$ adjacent to each other of the second photoelectric conversion module 309 are shown. However, the number of photoelectric conversion elements included in the second photoelectric conversion module 309 is not limited to this. A large number of photoelectric conversion elements 310 are formed on the translucent insulated substrate 311.

As the translucent insulated substrate 311, a tabular member or a sheet-like member formed of an insulative material having translucency such as glass or transparent resin is used.

As the reflective metal electrode layer 312, a single layer of silver (Ag) or a multilayer film in which silver (Ag) and zinc oxide (ZnO) are laminated in this order from the translucent insulated substrate 311 side is used. Aluminum (Al), gold (Au), copper (Cu), platinum (Pt), chrome (Cr), or the like can be used instead of silver (Ag). A transparent conductive film of indium tin oxide (ITO), tin oxide (SnO$_2$), or the like can be used instead of zinc oxide (ZnO). When necessary, an undercoat layer formed of silicon oxide (SiO$_2$) or the like can be formed on the translucent insulated substrate 311 as a layer for blocking impurities from the translucent insulated substrate 311.

The thin-film semiconductor layer 313 is arranged in front of the reflective metal electrode layer 312 viewed from the light incident side, has a P-I-N structure, and is formed by laminating one or more thin-film semiconductor layers that perform power generation using incident light. The thin-film semiconductor layer 313 forms an N-I-P junction including, from the translucent insulated substrate 311 side, an N-type semiconductor layer, which is the third conductive semiconductor layer, an I-type semiconductor layer, which is the substantially intrinsic photoelectric conversion layer and the second conductive semiconductor layer, and a P-type semiconductor layer, which is the first conductive semiconductor layer. In this embodiment, the thin-film semiconductor layer 313 forms an N-I-P junction including, in order from the translucent insulated substrate 311 side, an n-type hydrogenated microcrystalline silicon (μc-Si:H) layer, which is the third conductive semiconductor layer, an i-type hydrogenated microcrystalline silicon (μc-Si:H) layer, which is the second conductive semiconductor layer, and a p-type hydrogenated microcrystalline silicon (μc-Si:H) layer, which is the first conductive semiconductor layer.

The thin-film semiconductor layer 313 can have a configuration of a two-stage P-I-N junction including, from the translucent insulated substrate 311 side, an n-type hydrogenated microcrystalline silicon (μc-SiC:H) layer, which is the third conductive semiconductor layer, an i-type hydrogenated microcrystalline silicon (μc-Si:H) layer, which is the second conductive semiconductor layer, a p-type hydrogenated microcrystalline silicon (μc-Si:H) layer, which is the first conductive semiconductor layer, an n-type hydrogenated microcrystalline silicon (μc-Si:H) layer, which is the third conductive semiconductor layer, an i-type hydrogenated amorphous silicon germanium (a-SiGe:H) layer, which is the second conductive semiconductor layer, and a p-type hydrogenated microcrystalline silicon (μc-Sc:H) layer, which is the first conductive semiconductor layer.

When a plurality of thin-film semiconductor layers are laminated and the thin-film semiconductor layer 313 is configured as in the two-stage N-I-P junction, intermediate layers of microcrystalline silicon oxide (μc-SiO$_x$(X=0 to 2), aluminum-added zinc oxide (ZnO:Al), or the like can be inserted among the N-I-P junction to improve electric and optical connection among the N-I-P junction.

The rear-surface transparent electrode layer 13 is formed of transparent conductive oxide (TCO) such as zinc oxide (ZnO), indium tin oxide (ITO), or tin oxide (SnO$_2$).

As a combination of the first photoelectric conversion module 302 and the second photoelectric conversion module 309, a lamination form of the thin-film semiconductor layers in the respective modules can be, for example, (1) one-stage pin junction—one-stage nip junction, (2) two-stage pin junction—one-stage nip junction, (3) one-stage pin junction—two-stage nip junction, and (4) two-stage pin junction—two-stage nip junction.

Width in the longitudinal direction of the translucent insulated substrate 304 in the photoelectric conversion element 303 (width in a line segment E-E' direction in FIG. 7-1) and width in a longitudinal direction of the translucent insulated substrate 311 in the photoelectric conversion element 310 (width in the segment E-E' direction in FIG. 7-1) are set the same. In the photoelectric conversion device 301, the photoelectric conversion element 303 and the photoelectric conversion element 310 are arranged in positions opposed to each other to form a pair of the photoelectric conversion element 303 and the photoelectric conversion element 310. In other words, in FIG. 7-2, the photoelectric conversion element 303a and the photoelectric conversion element 310a are arranged in positions opposed to each other to form a photoelectric conversion element pair. The photoelectric conversion element 303b and the photoelectric conversion element 310b are arranged in positions opposed to each other to form a photoelectric conversion element pair. The photoelectric conversion element pairs can be regarded as new photoelectric conversion elements.

As shown in FIG. 7-3, the rear-surface transparent electrode layer 307 of the first photoelectric conversion module 302 and the rear-surface transparent electrode layer 314 of the second photoelectric conversion module 309 are electrically connected by a conductive layer 321 in an outer peripheral region 315 in the latitudinal direction of the translucent insulated substrate 304 (the translucent insulated substrate 311) (a line segment F-F' direction in FIG. 1-1). The conductive layer 321 is formed of conductive resin such as metal paste or an anisotropic conductive film. Consequently, the pair of the photoelectric conversion element 303 and the photoelectric conversion element 310 opposed to each other are electrically connected. Metal included in the conductive resin is desirably any one or more of gold, silver, nickel, and palladium having low contact resistance from which a conductive film is hardly formed. With such a configuration, photoelectric conversion elements opposed to each other are electrically directly connected and have an element configuration same as that of a laminated thin-film photoelectric conversion element formed on the same substrate. All photoelectric conversion element pairs of the photoelectric conversion device 301 of the mechanical stack type have substantially the same characteristics.

A connection region 305a where the thin-film semiconductor layer 306 and the rear-surface transparent electrode layer 307 are not laminated is provided in a region at the other end in the longitudinal direction of the translucent insulated substrate 304 in the photoelectric conversion element 303 (a line segment E-E' direction in FIG. 7-1) on the front surface on the second photoelectric conversion module 309 side in the transparent electrode layer 305 of the photoelectric conversion element 303b. On the other hand, a connection region 312a where the thin-film semiconductor layer 313 and the rear-surface transparent electrode layer 314 are not laminated is provided in a region at one end in the longitudinal direction of the translucent insulated substrate 311 in the photoelectric conversion element 310 (the line segment E-E' direction in FIG. 7-1) on the front surface on the first photoelectric conversion module 302 side in the reflective metal electrode layer 312 of the photoelectric conversion element 310a.

The connection region 305a of the photoelectric conversion element 303b and the connection region 312a of the photoelectric conversion element 310a adjacent to the photoelectric conversion element 310b opposed to the photoelectric conversion element 303b are electrically connected by a conductive layer 322. The conductive layer 322 is formed of conductive resin such as metal paste or an anisotropic conductive film. Consequently, the transparent electrode layer 305 of the photoelectric conversion element 303 and reflective metal electrode layer 312 of the photoelectric conversion element 310 adjacent to and forming a pair with the photoelectric conversion element 303 are electrically connected. Metal included in the conductive resin is desirably any one or more of gold, silver, nickel, and palladium having low contact resistance from which a conductive film is hardly formed. With such a configuration, photoelectric conversion elements adjacent to each other are electrically directly connected and have an element configuration same as a configuration in which a laminated thin-film photoelectric conversion element formed on the same substrate is connected in series.

Light transmitted through the photoelectric conversion element 303 and the wavelength selective reflection layer 308 is irradiated on the photoelectric conversion element 310. In this case, the wavelength selective reflection layer 308 transmits wavelength light absorbed by the photoelectric conversion element 310.

In the photoelectric conversion device 301 of the mechanical stack type according to the third embodiment configured as explained above, as in the photoelectric conversion device 1 of the mechanical stack type according to the first embodiment, photoelectric conversion element pairs opposed to each other are electrically connected and the photoelectric conversion element 303 and the photoelectric conversion element 310 adjacent to and forming a pair with the photoelectric conversion element 303 are electrically connected, whereby all the photoelectric conversion elements 303 and all the photoelectric conversion elements 310 are alternately connected in series. Consequently, the photoelectric conversion device 301 of the mechanical stack type according to the third embodiment has a connection configuration equivalent to that of the laminated thin-film photoelectric conversion device. Therefore, the photoelectric conversion elements 303 and 310 operate at optimum operating points and power generation efficiency is improved. As a result, the photoelectric conversion device 301 of the mechanical stack type according to the third embodiment has an unprecedented remarkable effect that photoelectric conversion efficiency equivalent to that of the laminated thin-film photoelectric conversion device can be realized by the photoelectric conversion device of the mechanical stack type.

In the photoelectric conversion device 301 of the mechanical stack type according to the third embodiment, as in the photoelectric conversion device 1 of the mechanical stack type according to the first embodiment, the photoelectric conversion element pairs are connected in series in a configuration equivalent to that of the laminated thin-film photoelectric conversion device. Therefore, the output extracting sections necessary for the respective two photoelectric conversion modules in the past are consolidated in a single place (not shown). In other words, the output extracting section only has to be provided in one place only in each of photoelectric conversion elements at both ends among a plurality of photoelectric conversion elements connected in series. Consequently, because the configuration of the photoelectric conversion device 301 is simplified, a manufacturing process can be simplified and members used for the output extracting section can be reduced. Therefore, a reduction in cost is possible.

In addition, in such a photoelectric conversion device 301 of the mechanical stack type according to the third embodiment, the wavelength selective reflection layer 308 having wavelength selectivity is inserted between the photoelectric conversion element 303 and the photoelectric conversion element 310. Therefore, light once transmitted through the photoelectric conversion elements 303 can be returned to the photoelectric conversion element 303 side. Light absorbed by the photoelectric conversion element 303 increases. Consequently, there is also an advantage that it is possible to reduce the film thickness of the second conductive semiconductor layer of the thin-film semiconductor layer 306, which is a light absorbing layer, and manufacturing time is reduced.

Figures 1, 8:
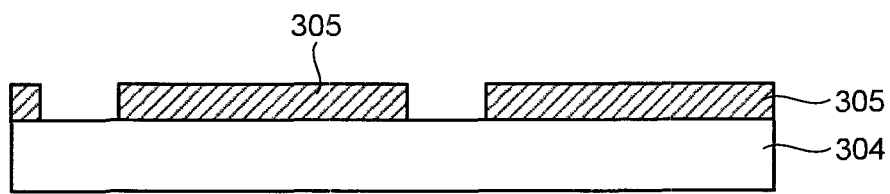
Figures 2, 8:
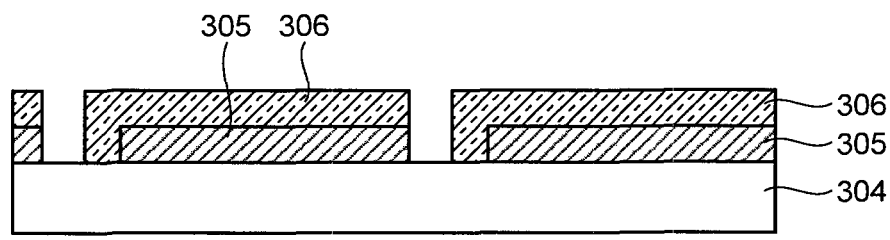
Figures 3, 8:
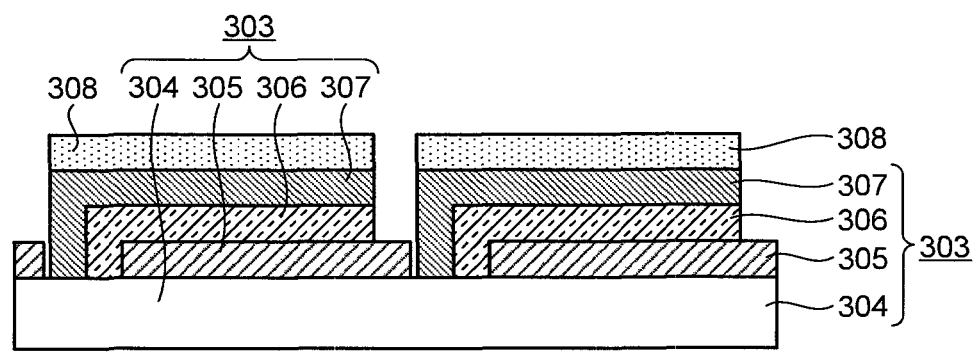
Figures 4, 8:
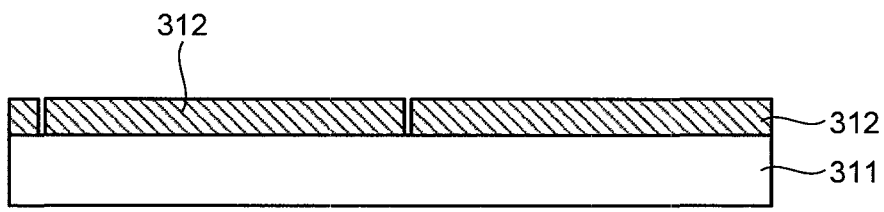
Figures 5, 8:
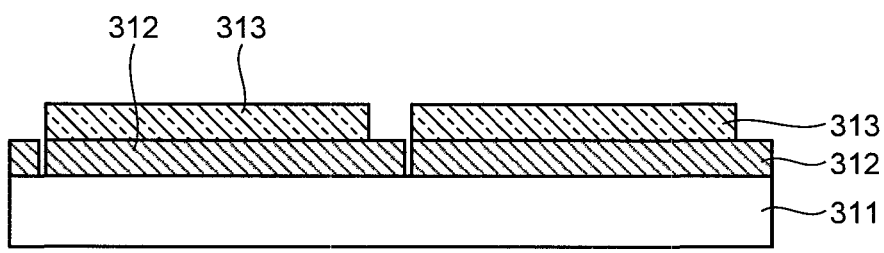
Figures 6, 8:
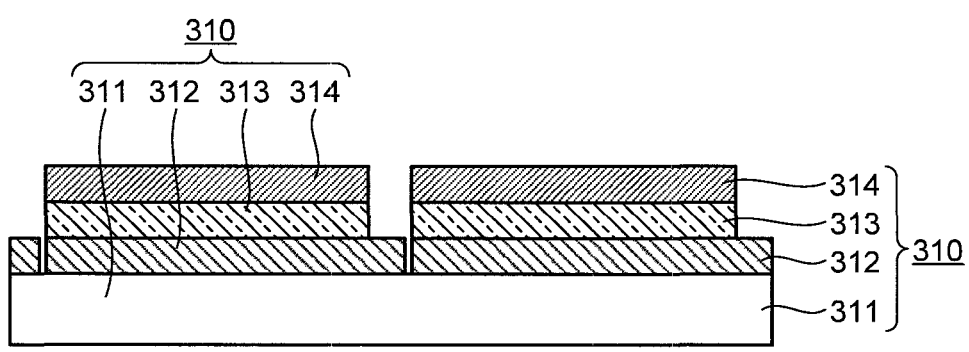

A method of manufacturing such a photoelectric conversion device 301 of the mechanical stack type according to the third embodiment is explained with reference to FIGS. 8-1 to 8-6. FIGS. 8-1 to 8-6 are sectional views for explaining a manufacturing process for the photoelectric conversion device 301 of the mechanical stack type according to the third embodiment.

First, the first photoelectric conversion module 302 is manufactured. In the first place, for example, a glass substrate of a flat plate shape is prepared as the translucent insulated substrate 304. The transparent electrode layer 305 formed of a transparent conductive oxide (TCO) such as tin oxide ($SnO_2$), zinc oxide (ZnO), or indium oxide ($In_2O_3$) having an uneven texture structure on the surface thereof is formed on one surface side of the translucent insulated substrate 304.

Subsequently, a part of the transparent electrode layer 305 is cut and removed in a stripe shape in the direction substantially parallel to the latitudinal direction of the translucent insulated substrate 304 by laser irradiation to pattern the transparent electrode layer 305 in a stripe shape and separate the transparent electrode layer 305 into a plurality of transparent electrode layers 305 (FIG. 8-1).

The thin-film semiconductor layer 306 for photoelectric conversion formed of, for example, amorphous silicon is formed on the transparent electrode layers 305 by a plasma CVD method or the like. As the thin-film semiconductor layer 306, a p-type hydrogenated amorphous silicon carbide (a-SiC:H) layer, which is the first conductive semiconductor layer, an i-type hydrogenated amorphous silicon (a-Si:H) layer, which is the second conductive semiconductor layer, and an n-type hydrogenated amorphous silicon (a-Si:H) layer, which is the third conductive semiconductor layer, are sequentially formed from the translucent insulated substrate 304 side. In places in a part of positions where the transparent electrode layers 305 are cut, a part of the thin-film semiconductor layer 306 is cut and removed in a stripe shape in the direction substantially parallel to the latitudinal direction of the translucent insulated substrate 304 to pattern the thin-film semiconductor layer 306 in a stripe shape and separate the thin-film semiconductor layer 306 into a plurality of thin-film semiconductor layers 306 (FIG. 8-2).

The rear-surface transparent electrode layer 307 formed of a transparent conductive oxide (TOO) such as tin oxide ($SnO_2$), zinc oxide (ZnO), or indium oxide ($In_2O_3$) is formed on the thin-film semiconductor layers 306 by a sputtering method or the like.

The wavelength selective reflection layer 308 formed of lamination of tin oxide ($SnO_2$), hydrogenated amorphous silicon (a-Si:H), and silicon oxide ($SiO_2$) is formed on the rear-surface transparent electrode layer 307 by a plasma CVD method or the like. The rear-surface transparent electrode layer 307, the thin-film semiconductor layers 306, and the wavelength selective reflection layer 308 are cut and removed by laser irradiation in places where the transparent electrode layers 305 and the thin-film semiconductor layers 306 are cut and places adjacent to the places to pattern the rear-surface transparent electrode layer 307 and the wavelength selective reflection layer 308 in a stripe shape and separate the rear-surface transparent electrode layer 307 and the wavelength selective reflection layer 308 into a plurality of rear-surface transparent electrode layers 307 and a plurality of wavelength selective reflection layers 308 (FIG. 8-3). Consequently, the layers are separated for each of the photoelectric conversion elements 303 and the first photoelectric conversion module 302 is obtained.

Next, the second photoelectric conversion module 309 is manufactured. In the first place, for example, a glass substrate of a flat plate shape is prepared as the translucent insulated substrate 311. The reflective metal electrode layer 312 formed of a light-reflecting metal layer of silver (Ag) or the like having an uneven texture structure on the surface thereof is formed on one surface side of the translucent insulated substrate 311.

Subsequently, a part of the reflective metal electrode layer 312 is cut and removed in a stripe shape in the direction substantially parallel to the latitudinal direction of the translucent insulated substrate 311 by laser irradiation to pattern the reflective metal electrode layer 312 in a stripe shape and separate the reflective metal electrode layer 312 into a plurality of reflective metal electrode layers 312 (FIG. 8-4).

The thin-film semiconductor layer 313 for photoelectric conversion formed of, for example, hydrogenated microcrystalline silicon is formed on the reflective metal electrode layers 312 by the plasma CVD method or the like. As the thin-film semiconductor layer 313, an n-type hydrogenated microcrystalline silicon (μc-Si:H) layer, which is the third conductive semiconductor layer, an i-type hydrogenated microcrystalline silicon (μc-Si:H) layer, which is the second conductive semiconductor layer, and a p-type hydrogenated microcrystalline silicon (μc-Si:H) layer, which is the first conductive semiconductor layer, are sequentially formed from the translucent insulated substrate 311 side. A part of the thin-film semiconductor layer 313 is cut and removed in a stripe shape in the direction substantially parallel to the latitudinal direction of the translucent insulated substrate 311 by laser irradiation in places where the reflective metal electrode layers 312 are cut or places adjacent to the places to pattern the thin-film semiconductor layer 313 in a stripe shape and separate the thin-film semiconductor layer 313 into a plurality of thin-film semiconductor layers 313 (FIG. 8-5).

The rear-surface transparent electrode layer 314 formed of a transparent conductive oxide (TCO) such as tin oxide ($SnO_2$), zinc oxide (ZnO), or indium oxide ($In_2O_3$) is formed on the thin-film semiconductor layers 313 by the sputtering method or the like. The rear-surface transparent electrode layer 314 is cut and removed by laser irradiation in places same as positions of the cutting of the thin-film semiconductor layers 313 to pattern the rear-surface transparent electrode layer 314 in a stripe shape and separate the rear-surface transparent electrode layer 13 into a plurality of rear-surface transparent electrode layers 314 (FIG. 8-6). Consequently, the layers are separated for each of the photoelectric conversion elements 310 and the second photoelectric conversion module 309 is obtained.

A light transmissive resin layer is formed as the intermediate layer 323 over the entire surface on the photoelectric conversion element 310 in the second photoelectric conversion module 309. In the light transmissive resin layer, a contact hole is opened in a place where the photoelectric conversion element 303 and the photoelectric conversion element 310 are electrically connected, i.e., a place where the conductive layer 321 and the conductive layer 322 are formed. Thereafter, conductive paste or a conductive film is filled in the contact hole by a method such as application or printing to form the conductive layer 321 and the conductive layer 322.

The first photoelectric conversion module 302 is arranged on the intermediate layer 323 such that the photoelectric conversion element 303 and the photoelectric conversion element 310 forming a pair are opposed to each other. The first photoelectric module 302 and the second photoelectric module 309 are bonded together with the photoelectric conversion element 303 and the photoelectric conversion element 310 placed on the inner side and are heated and pressed, for example, in vacuum. Consequently, first photoelectric conversion module 302 and the second photoelectric conversion module 309 are integrated. The rear-surface transparent electrode layer 307 of the first photoelectric conversion module 302 and the rear-surface transparent electrode layer 314 of the second photoelectric conversion module 309 are electrically connected by the conductive layer 321. The transparent electrode layer 305 of the photoelectric conversion element 303 and the reflective metal electrode layer 312 of the photoelectric conversion element 310 adjacent to the photoelectric conversion element 310 opposed to the photoelectric conversion element 303 are electrically connected by the conductive layer 322. The photoelectric conversion device 301 of the mechanical stack type shown in FIGS. 8-1 to 8-3 is obtained. Thereafter, one output extracting section (not shown) is formed in each of only photoelectric conversion elements at both ends among a plurality of photoelectric conversion elements connected in series.

As explained above, in the photoelectric conversion device 301 of the mechanical stack type according to the third embodiment, the photoelectric conversion element pairs opposed to each other are electrically connected and the photoelectric conversion element 303 and the photoelectric conversion element 310 adjacent to and forming a pair with the photoelectric conversion element 303 are electrically connected. Consequently, all the photoelectric conversion elements 303 and all the photoelectric conversion elements 310 are alternately connected in series as indicated by the equivalent circuit shown in FIG. 2. Therefore, because the photoelectric conversion device 301 of the mechanical stack type according to the third embodiment has a connection configuration equivalent to that of the laminated thin-film photoelectric conversion device, the photoelectric conversion elements 303 and 310 operate at optimum operating points and power generation efficiency is improved. As a result, the photoelectric conversion device 301 of the mechanical stack type according to the third embodiment has an unprecedented remarkable effect that photoelectric conversion efficiency equivalent to that of the laminated thin-film photoelectric conversion device can be realized by the photoelectric conversion device of the mechanical stack type.

In the photoelectric conversion device 301 of the mechanical stack type according to the third embodiment, the photoelectric conversion element pairs are connected in series in a configuration equivalent to that of the laminated thin-film photoelectric conversion device. Therefore, the output extracting sections necessary for the respective two photoelectric conversion modules in the past are consolidated in a single place (not shown). In other words, the output extracting section only has to be provided in one place only in each of photoelectric conversion elements at both ends among a plurality of photoelectric conversion elements connected in series. Consequently, because the configuration of the photoelectric conversion device 301 is simplified, the photoelectric conversion device 301 is excellent in durability, a manufacturing process can be simplified, and members used for the output extracting section can be reduced. Therefore, a reduction in cost is possible.

In the photoelectric conversion device 301 of the mechanical stack type according to the third embodiment, the wavelength selective reflection layer 308 having wavelength selectivity is inserted between the photoelectric conversion element 303 and the photoelectric conversion element 310. Therefore, light once transmitted through the photoelectric conversion elements 303 can be returned to the photoelectric conversion element 303 side. Light absorbed by the photoelectric conversion element 303 increases. Consequently, it is possible to reduce the film thickness of the second conductive semiconductor layer of the thin-film semiconductor layer 306, which is a light absorbing layer, manufacturing time is reduced, and a further reduction in manufacturing cost can be realized.

As explained above, with the method of manufacturing the photoelectric conversion device 301 of the mechanical stack type according to the third embodiment, the photoelectric conversion element pairs opposed to each other are electrically connected and the photoelectric conversion element 303 and the photoelectric conversion element 310 adjacent to and forming a pair with the photoelectric conversion element 303 are electrically connected. Consequently, all the photoelectric conversion elements 303 and all the photoelectric conversion elements 310 are alternately connected in series. Therefore, with the method of manufacturing the photoelectric conversion device 301 of the mechanical stack type according to the third embodiment, it is possible to realize a photoelectric conversion device of a mechanical stack type in which the photoelectric conversion element pairs are connected in series and that has a configuration equivalent to that of the laminated thin-film photoelectric conversion device and has photoelectric conversion efficiency equivalent to that of the laminated thin-film photoelectric conversion device.

With the method of manufacturing the photoelectric conversion device 301 of the mechanical stack type according to the third embodiment, the photoelectric conversion element pairs are connected in series in a configuration equivalent to that of the laminated thin-film photoelectric conversion device. Therefore, the output extracting sections necessary for the respective two photoelectric conversion modules in the past are consolidated in a single place. In other words, the output extracting section only has to be provided in one place only in each of photoelectric conversion elements at both ends among a plurality of photoelectric conversion elements connected in series. Consequently, a manufacturing process can be simplified and members used for the output extracting section can be reduced. Therefore, a reduction in cost is possible.

With the method of manufacturing the photoelectric conversion device 301 of the mechanical stack type according to the third embodiment, the wavelength selective reflection layer 308 having wavelength selectivity is inserted between the photoelectric conversion element 303 and the photoelectric conversion element 310. Therefore, light once transmitted through the photoelectric conversion elements 303 can be returned to the photoelectric conversion element 303 side. Light absorbed by the photoelectric conversion element 303 increases. Consequently, it is possible to reduce the film thickness of the second conductive semiconductor layer of the thin-film semiconductor layer 306, which is a light absorbing layer, manufacturing time is reduced, and a further reduction in manufacturing cost can be realized.

INDUSTRIAL APPLICABILITY

As explained above, the photoelectric conversion device according to the present invention is useful for realizing a photoelectric conversion device of a mechanical stack type having high power generation efficiency same as that of the laminated thin-film photoelectric conversion device.

REFERENCE SIGNS LIST 1 photoelectric conversion device
2 first photoelectric conversion module
3 photoelectric conversion element
3a photoelectric conversion element
3b photoelectric conversion element
4 translucent insulated substrate
5 transparent electrode layer
5a connection region
6 thin-film semiconductor layer
7 rear-surface transparent electrode layer
8 second photoelectric conversion module
9 photoelectric conversion element
9a photoelectric conversion element
9b photoelectric conversions element
10 translucent insulated substrate
11 reflective metal electrode layer
11a connection region
12 thin-film semiconductor layer
13 rear-surface transparent electrode layer
14 outer peripheral region
21 conductive layer
22 conductive layer
23 intermediate layer
101 photoelectric conversion device
102 first photoelectric conversion module
103 photoelectric conversion element
103a photoelectric conversion element
103b photoelectric conversion element
104 translucent insulated substrate
105 transparent electrode layer
106 thin-film semiconductor layer
107 rear-surface transparent electrode layer
107a connection region
108 second photoelectric conversion module
109 photoelectric conversion element
109a photoelectric conversion element
109b photoelectric conversion element
110 translucent insulated substrate
111 reflective metal electrode layer
112 thin-film semiconductor layer
113 rear-surface transparent electrode layer
113a connection region
114 outer peripheral region
121 conductive layer
122 conductive layer
123 intermediate layer
201 photoelectric conversion element
202 photoelectric conversion element
211 first photoelectric conversion module
212 second photoelectric conversion module
301 photoelectric conversion device
302 first photoelectric conversion module
303 photoelectric conversion element
303a photoelectric conversion element
303b photoelectric conversion element
304 translucent insulated substrate
305 transparent electrode layer
305a connection region
306 thin-film semiconductor layer
307 rear-surface transparent electrode layer
308 wavelength selective reflection layer
309 second photoelectric conversion module
310 photoelectric conversion element
310a photoelectric conversion element
310b photoelectric conversion element
311 translucent insulated substrate
312 reflective metal electrode layer
312a connection region
313 thin-film semiconductor layer
314 rear-surface transparent electrode layer
315 outer peripheral region
321 conductive layer
322 conductive layer
323 intermediate layer
330 first reflection layer
331 second reflection layer
332 third reflection layer

The invention claimed is:

1. A photoelectric conversion device comprising:
a first photoelectric conversion module having a plurality of first photoelectric conversion elements formed on one surface of a translucent first insulated substrate and a second photoelectric conversion module having a plurality of second photoelectric conversion elements formed on one surface of a second insulated substrate,
wherein each of the first photoelectric conversion elements comprises, in sequential order from the translucent first insulated substrate, a first transparent electrode layer, a first thin-film semiconductor layer laminated on the first transparent electrode layer, and a second transparent electrode layer laminated on the first thin-film semiconductor layer;
wherein each of the second photoelectric elements comprises, in sequential order from the second insulated substrate, a reflective metal electrode layer, a second thin-film semiconductor layer laminated on the reflective metal electrode layer, and a third transparent electrode layer laminated on the second thin-film semiconductor layer;
wherein the first and second photoelectric conversion elements are bonded together with the second transparent electrode layers of the first photoelectric conversion elements disposed opposite the third transparent electrode layers of the second photoelectric conversion elements to obtain a plurality of opposed pairs of first and second photoelectric conversion elements;
wherein first conductive layers are disposed to directly contact the second transparent electrode layers of the first photoelectric conversion elements and the third transparent electrode layers of the second photoelectric conversion elements to electrically connect the first and second photoelectric conversion element of each opposed pair in series; and wherein second conductive layers are disposed to directly contact the first transparent electrode layers of the first photoelectric conversion elements and the reflective metal electrode layers of the second photoelectric conversion elements to electrically connect each opposed pair of first and second photoelectric conversion elements in series.

2. The photoelectric conversion device according to claim 1, wherein the first conductive layers and/or the second conductive layers comprise conductive resin.

3. The photoelectric conversion device according to claim 2, wherein metal included in the conductive resin is any one or more of gold, silver, nickel, and palladium.

4. The photoelectric conversion device according to claim 1, wherein the first conductive layers and/or the second conductive layers comprise metal paste.

5. The photoelectric conversion device according to claim 1, wherein the photoelectric conversion device includes, between the second transparent electrode layers of the first photoelectric conversion elements and the third transparent electrode layers of the second photoelectric conversion elements arranged in the positions opposed to each other, wavelength selective reflection layers having wavelength selectivity for reflecting only light having wavelength in a specific range.

6. The photoelectric conversion device according to claim 5, wherein the wavelength selective reflection layers are formed by laminating a plurality of layers having different indexes of refraction.

7. The photoelectric conversion device according to claim 1, wherein a band gap of the first thin film semiconductor layer is wider than a band gap of the second thin film semiconductor layer.

8. The photoelectric conversion device according to claim 7, wherein the first thin-film semiconductor layer is formed by laminating, from the first transparent electrode layer side, a first p-type thin-film silicon layer, a first i-type thin-film amorphous silicon layer, and a first n-type thin-film silicon layer, and the second thin-film semiconductor layer is formed by laminating, from the reflective metal electrode layer side, a second n-type thin-film silicon layer, a second i-type thin-film microcrystalline silicon layer, and a second p-type thin-film silicon layer.

9. A method of manufacturing a photoelectric conversion device, comprising:

forming a first photoelectric conversion module having a plurality of first photoelectric conversion elements formed on one surface of a translucent first insulated substrate, wherein each of the first photoelectric conversion elements comprises, in sequential order from the translucent first insulated substrate, a first transparent electrode layer, a first thin-film semiconductor layer laminated on the first transparent electrode layer, and a second transparent electrode layer laminated on the first thin-film semiconductor layer;

forming a second photoelectric conversion module having a plurality of second photoelectric conversion elements formed on one surface of a second insulated substrate, wherein each of the second photoelectric conversion elements comprises, in sequential order from the second insulated substrate, a reflective metal electrode layer, a second thin-film semiconductor layer laminated on the reflective metal electrode layer, and a third transparent electrode layer laminated on the second thin-film semiconductor layer; and bonding the first and second photoelectric conversion elements together with the second transparent electrode layers of the first photoelectric conversion elements disposed opposite the third transparent electrode layers of the second photoelectric conversion elements to obtain a plurality of opposed pairs of first and second photoelectric conversion elements, wherein first conductive layers are disposed to directly contact the second transparent electrode layers of the first photoelectric conversion elements and the third transparent electrode layers of the second photoelectric conversion elements to electrically connect the first and second photoelectric conversion element of each opposed pair in series, and wherein second conductive layers are disposed to directly contact the first transparent electrode layers of the first photoelectric conversion elements and the reflective metal electrode layers of the second photoelectric conversion elements to electrically connect each opposed pair of first and second photoelectric conversion elements in series.

10. The method of manufacturing a photoelectric conversion device according to claim 9, wherein forming the photoelectric conversion device includes arranging, between the second transparent electrode layers of the first photoelectric conversion elements and the third transparent electrode layers of the second photoelectric conversion elements opposed to each other, wavelength selective reflection layers having wavelength selectivity for reflecting only light having wavelength in a specific range.

11. The photoelectric conversion device according to claim 10, wherein the wavelength selective reflection layers are formed by laminating a plurality of layers having different indexes of refraction.

* * * * *